(12) United States Patent
Ramamurthy et al.

(10) Patent No.: US 11,908,519 B2
(45) Date of Patent: Feb. 20, 2024

(54) PRE-COMPARE OPERATION FOR COMPACT LOW-LEAKAGE DUAL-COMPARE CAM CELL

(71) Applicant: INTERNATIONAL BUSINESS MACHINES CORPORATION, Armonk, NY (US)

(72) Inventors: Hema Ramamurthy, Austin, TX (US); Michael Lee, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 192 days.

(21) Appl. No.: 17/462,659

(22) Filed: Aug. 31, 2021

(65) Prior Publication Data
US 2023/0065603 A1    Mar. 2, 2023

(51) Int. Cl.
G11C 15/04    (2006.01)

(52) U.S. Cl.
CPC ..................... G11C 15/04 (2013.01)

(58) Field of Classification Search
CPC ........................................................ G11C 15/04
USPC ......................................................... 365/49.17
See application file for complete search history.

(56) References Cited

U.S. PATENT DOCUMENTS

| | | |
|---|---|---|
| 6,266,263 B1 | 7/2001 | Lien et al. |
| 6,584,003 B1 | 6/2003 | Kim et al. |
| 6,704,216 B1 | 3/2004 | Cheng et al. |
| 6,781,857 B1 | 8/2004 | Lien et al. |
| 6,958,925 B1 * | 10/2005 | Om et al. ............... G11C 15/04 365/49 |
| 7,050,318 B1 * | 5/2006 | Argyres .................. G11C 15/00 365/49 |
| 7,414,873 B2 | 8/2008 | Winograd et al. |
| 7,852,652 B1 | 12/2010 | Fabry |
| 8,513,791 B2 | 8/2013 | Bucki et al. |
| 8,929,116 B2 | 1/2015 | Arsovski et al. |
| 9,019,737 B2 | 4/2015 | Argyres |
| 9,070,435 B2 | 6/2015 | Iyengar |
| 2003/0188244 A1 * | 10/2003 | Sheaffer .................. G06F 11/00 714/735 |

OTHER PUBLICATIONS

Huang et al., "Low Power Content Addressable Memory With Pre-Comparison Sceheme and Dual-VDD Techmique", Department of Electronics, and Microelectronics and Information Systems Research Centre (online), Apr. 2021, 4 pages, URL: https://www.academia.edu10073318LOW_POWER_CONTENT_ADDRESSABLE_MEMORY_WITH_PRE_COMPARISON_SCEHEME_AND_DUAL_VDD_TECHMIQUE.

* cited by examiner

*Primary Examiner* — Connie C Yoha
(74) *Attorney, Agent, or Firm* — Nathan M. Rau

(57) ABSTRACT

Pre-comparing data in a dual compare content compact, low-leakage multi-bit content-addressable memory (CAM) cell is provided. A first compare input and a second compare input of a column in a dual compare content addressable memory ("CAM") device. A pre-compare signal is generated based on comparing the first compare input and the second compare input. A first polarity of the first compare input is compared with a first polarity a storage node data. A compare output of the first compare input is generated based on a logic state of the pre-compare signal. A first compare match is generated based on the compare output and a second compare match is generated based on the pre-compare signal.

20 Claims, 20 Drawing Sheets

| Q' | QB' | CMP0_T | CMP1_T | CMP0_OUT | CMP1_OUT | Results/Comments |
|---|---|---|---|---|---|---|
| 1 | 0 | 0 | 0 | 0 | 0 | Mismatch CMP0, CMP1 |
| 1 | 0 | 0 | 1 | 0 | 1 | Match CMP1, Mismatch CMP0 |
| 1 | 0 | 1 | 0 | 1 | 0 | Match CMP0, Mismatch CMP1 |
| 1 | 0 | 1 | 1 | 0 | 0 | Mismatch CMP0, CMP1 |
| 0 | 1 | 0 | 0 | 1 | 1 | Match CMP0, CMP1 |
| 0 | 1 | 1 | 1 | 1 | 0 | Match CMP0, Mismatch CMP1 |
| 0 | 1 | 1 | 0 | 0 | 1 | Match CMP1, Mismatch CMP0 |
| 0 | 1 | 1 | 1 | 0 | 0 | Mismatch CMP0, CMP1 |

Compare A Compare Data Input With Storage Node Data Having A First Logic State Using A Transmission Gate, Having A Positive Field Effect Transistor ("PFET") And A Negative Field Effect Transistor ("NFET")

1010

Compare The Compare Data Input Having A First Logic State With The Storage Node Data Having A Second Logic State Using A Passgate, Wherein The Passgate Is An N-Channel Metal Oxide Semiconductor (NMOS) Transistor And The Storage Node Data Of A Storage Cell Is Used To Control The Passgate Based On The Storage Node Data

1020

Compare The Compare Data Input With The Storage Node Data Having The Second Logic State Using A PFET Stack, Having A First PFET And A Second PFET

Compare The Compare Data Input Having A First Logic State With The Storage Node Data Having A Second Logic State Using A Passgate, Wherein The Passgate Is An N-Channel Metal Oxide Semiconductor (NMOS) Transistor And The Storage Node Data Of A Storage Cell Is Used To Control The Passgate Based On The Storage Node Data
1020

Indicate The Compare Data Input Fails To Match The Storage Node Data Using The Passgate Based Upon The Compare Data Input Having The First Logic State And The Storage Node Data Having The Second Logic State
1210

Compare The Compare Data Input With The Storage Node Data Having The Second Logic State Using A PFET Stack, Having A First PFET And A Second PFET
1030

Indicate The Compare Data Input Matches The Storage Node Data Using The PFET Stack Based Upon The Compare Data Input Having The Second Logic State And The Storage Node Data Having The Second Logic State
1220

FIG. 12

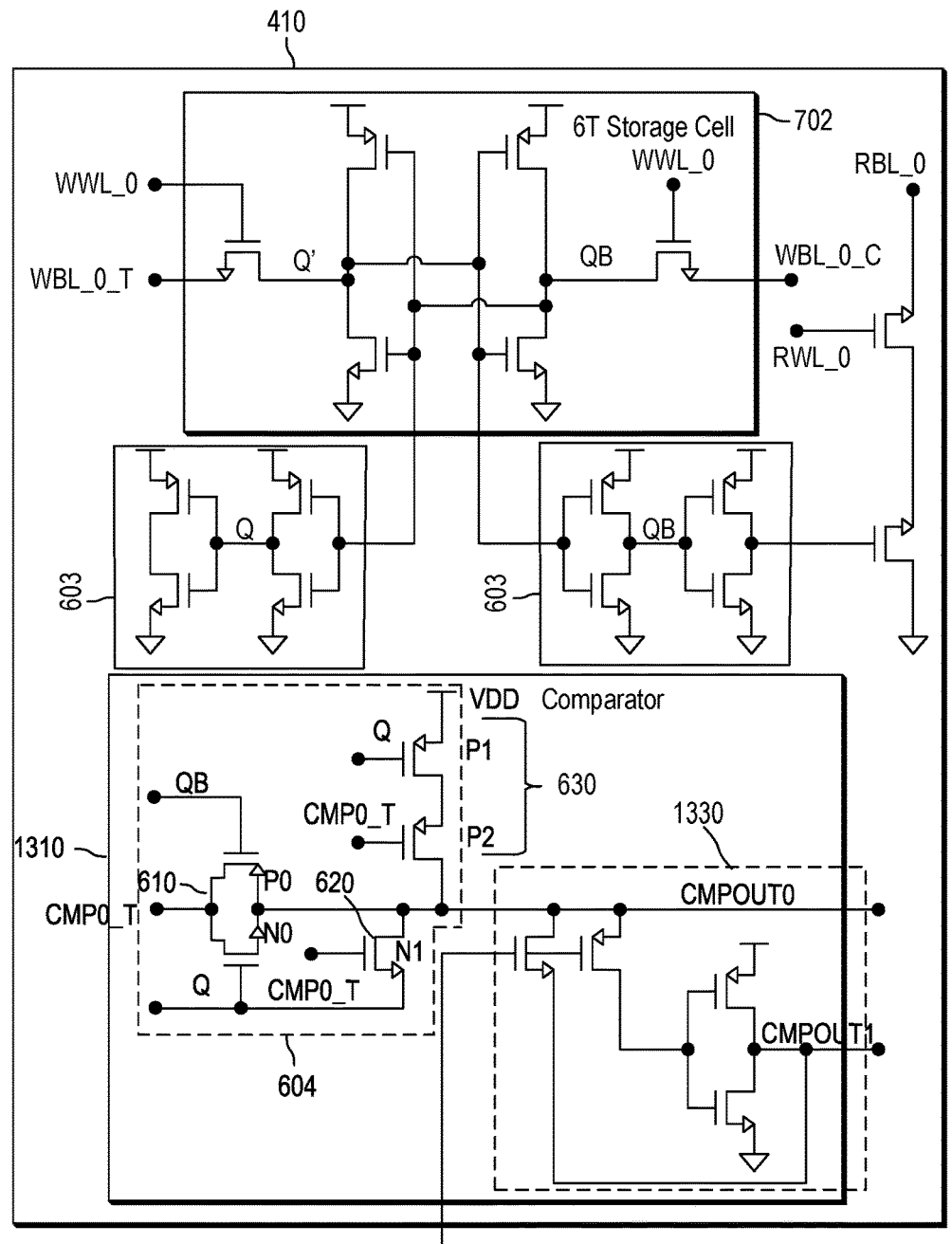
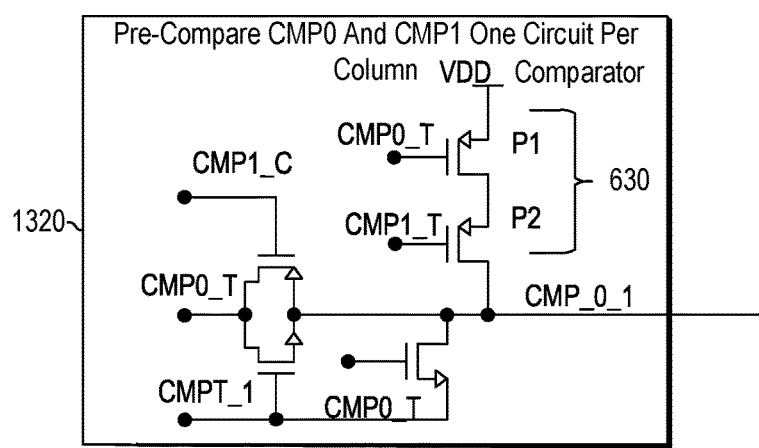
FIG. 13

1500

| CMP0_T | CMP1_T | CMP_0_1 |
|--------|--------|---------|
| 0 | 0 | 1 |
| 1 | 1 | 1 |
| 0 | 1 | 0 |
| 1 | 0 | 0 |

FIG. 15

```
┌─────────────────────────────────────────────────────────────┐
│  Compare A First Compare Input And A Second Compare Input   │
│  Of A Column In A Dual Compare Content Addressable Memory   │
│                      ("CAM") Device                          │
│                          1610                                │
└─────────────────────────────────────────────────────────────┘
                              │
                              ▼
┌─────────────────────────────────────────────────────────────┐
│  Generate A Pre-Compare Signal Based On Comparing The First │
│           Compare Input And The Second Compare Input         │
│                          1620                                │
└─────────────────────────────────────────────────────────────┘
                              │
                              ▼
┌─────────────────────────────────────────────────────────────┐
│  Compare A First Polarity Of The First Compare Input With A │
│              First Polarity A Storage Node Data              │
│                          1630                                │
└─────────────────────────────────────────────────────────────┘
                              │
                              ▼
┌─────────────────────────────────────────────────────────────┐
│  Generate A Compare Output Of The First Compare Input Based │
│          On A Logic State Of The Pre-Compare Signal          │
│                          1640                                │
└─────────────────────────────────────────────────────────────┘
                              │
                              ▼
┌─────────────────────────────────────────────────────────────┐
│  Generate A Compare Output Of The First Compare Input Based │
│          On A Logic State Of The Pre-Compare Signal          │
│                          1650                                │
└─────────────────────────────────────────────────────────────┘
```

FIG. 16

```
┌─────────────────────────────────────────────────────────────┐
│ Compare A First Compare Input And A Second Compare Input    │
│ Of A Column In A Dual Compare Content Addressable Memory    │
│ ("CAM") Device                                              │
│ 1610                                                        │
│  ┌────────────────────────────────────────────────────────┐ │
│  │ Determine The First Compare Input And A Second Compare │ │
│  │ Input Have Similar Logic States or Dissimilar Logic    │ │
│  │ states                                                 │ │
│  │ 1710                                                   │ │
│  └────────────────────────────────────────────────────────┘ │
└─────────────────────────────────────────────────────────────┘
                              ↓
┌─────────────────────────────────────────────────────────────┐
│ Generate A Pre-Compare Signal Based On Comparing The First  │
│ Compare Input And The Second Compare Input                  │
│ 1620                                                        │
└─────────────────────────────────────────────────────────────┘
                              ↓
┌─────────────────────────────────────────────────────────────┐
│ Compare A First Polarity Of The First Compare Input With A  │
│ First Polarity A Storage Node Data                          │
│ 1630                                                        │
└─────────────────────────────────────────────────────────────┘
                              ↓
┌─────────────────────────────────────────────────────────────┐
│ Generate A Compare Output Of The First Compare Input Based  │
│ On A Logic State Of The Pre-Compare Signal                  │
│ 1640                                                        │
└─────────────────────────────────────────────────────────────┘
                              ↓
┌─────────────────────────────────────────────────────────────┐
│ Generate A Compare Output Of The First Compare Input Based  │
│ On A Logic State Of The Pre-Compare Signal                  │
│ 1650                                                        │
└─────────────────────────────────────────────────────────────┘
```

FIG. 17

```
┌─────────────────────────────────────────────────────────────┐
│ Compare A First Compare Input And A Second Compare Input Of │
│ A Column In A Dual Compare Content Addressable Memory       │
│ ("CAM") Device                                              │
│ 1610                                                        │
└─────────────────────────────────────────────────────────────┘
                              ↓
┌─────────────────────────────────────────────────────────────┐
│ Generate A Pre-Compare Signal Based On Comparing The First  │
│ Compare Input And The Second Compare Input                  │
│ 1620                                                        │
└─────────────────────────────────────────────────────────────┘
                              ↓
┌─────────────────────────────────────────────────────────────┐
│ Compare A First Polarity Of The First Compare Input With A  │
│ First Polarity A Storage Node Data                          │
│ 1630                                                        │
└─────────────────────────────────────────────────────────────┘
                              ↓
┌─────────────────────────────────────────────────────────────┐
│ Generate A Compare Output Of The First Compare Input Based  │
│ On A Logic State Of The Pre-Compare Signal                  │
│ 1640                                                        │
│  ┌───────────────────────────────────────────────────────┐  │
│  │ Determine A Logic State Of The Compare Output Based   │  │
│  │ On Comparing The First Polarity Of The First Compare  │  │
│  │ Input With The First Polarity A Storage Node Data     │  │
│  │ 1810                                                  │  │
│  └───────────────────────────────────────────────────────┘  │
└─────────────────────────────────────────────────────────────┘
                              ↓
┌─────────────────────────────────────────────────────────────┐
│ Generate A Compare Output Of The First Compare Input Based  │
│ On A Logic State Of The Pre-Compare Signal                  │
│ 1650                                                        │
└─────────────────────────────────────────────────────────────┘
```

FIG. 18

```
┌─────────────────────────────────────────────────────────────┐
│ Compare A First Compare Input And A Second Compare Input    │
│ Of A Column In A Dual Compare Content Addressable Memory    │
│ ("CAM") Device                                              │
│ 1610                                                        │
└─────────────────────────────────────────────────────────────┘
                              │
                              ▼
┌─────────────────────────────────────────────────────────────┐
│ Generate A Pre-Compare Signal Based On Comparing The First  │
│ Compare Input And The Second Compare Input                  │
│ 1620                                                        │
└─────────────────────────────────────────────────────────────┘
                              │
                              ▼
┌─────────────────────────────────────────────────────────────┐
│ Compare A First Polarity Of The First Compare Input With A  │
│ First Polarity A Storage Node Data                          │
│ 1630                                                        │
└─────────────────────────────────────────────────────────────┘
                              │
                              ▼
┌─────────────────────────────────────────────────────────────┐
│ Generate A Compare Output Of The First Compare Input Based  │
│ On A Logic State Of The Pre-Compare Signal                  │
│ 1640                                                        │
│  ┌────────────────────────────────────────────────────────┐ │
│  │ Set A Logic State Of The Compare Output As A First     │ │
│  │ Logic State Or A Second Logic State Based On Comparing │ │
│  │ The First Polarity Of The First Compare Input With The │ │
│  │ First Polarity A Storage Node Data                     │ │
│  │ 1910                                                   │ │
│  └────────────────────────────────────────────────────────┘ │
└─────────────────────────────────────────────────────────────┘
                              │
                              ▼
┌─────────────────────────────────────────────────────────────┐
│ Generate A Compare Output Of The First Compare Input Based  │
│ On A Logic State Of The Pre-Compare Signal                  │
│ 1650                                                        │
└─────────────────────────────────────────────────────────────┘
```

FIG. 19

```
┌─────────────────────────────────────────────────────────┐
│ Compare A First Compare Input And A Second Compare Input Of A Column In A │
│ Dual Compare Content Addressable Memory ("CAM") Device  │
│                         1610                            │
└─────────────────────────────────────────────────────────┘
                            │
                            ▼
┌─────────────────────────────────────────────────────────┐
│ Generate A Pre-Compare Signal Based On Comparing The First Compare Input │
│            And The Second Compare Input                 │
│                         1620                            │
└─────────────────────────────────────────────────────────┘
                            │
                            ▼
┌─────────────────────────────────────────────────────────┐
│ Compare A First Polarity Of The First Compare Input With A First Polarity A │
│                  Storage Node Data                      │
│                         1630                            │
└─────────────────────────────────────────────────────────┘
                            │
                            ▼
┌─────────────────────────────────────────────────────────┐
│ Generate A Compare Output Of The First Compare Input Based On A Logic │
│            State Of The Pre-Compare Signal              │
│                         1640                            │
└─────────────────────────────────────────────────────────┘
                            │
                            ▼
┌─────────────────────────────────────────────────────────┐
│ Generate A Compare Output Of The First Compare Input Based On A Logic │
│            State Of The Pre-Compare Signal              │
│                         1650                            │
│ ┌─────────────────────────────────────────────────────┐ │
│ │ Generate The First Compare Match By Combining The Compare Output │ │
│ │ From Each Bit In A Row Of The Dual Compare CAM Device And Generating │ │
│ │ The Second Compare Match By Combining The Pre-Compare Signa From │ │
│ │ Each Bit In A Row Of The Dual Compare CAM Device    │ │
│ │                       2010                          │ │
│ └─────────────────────────────────────────────────────┘ │
└─────────────────────────────────────────────────────────┘
```

PRE-COMPARE OPERATION FOR COMPACT LOW-LEAKAGE DUAL-COMPARE CAM CELL

BACKGROUND

The present disclosure relates in general to computing systems, and more particularly, to various embodiments for content addressable memories. Content Addressable memories ("CAM") are special type of embedded memories used for content addressing.

Content-addressable memory (CAM) is a special type of computer memory used in certain high-speed searching applications. Unlike standard computer memory (e.g., RAM) in which the user supplies a memory address and the RAM returns the data word stored at that address, a CAM is designed such that the user supplies a data word and the CAM searches its entire memory to see if that data word is stored anywhere in it. If the data word is found, the CAM returns a list of one or more storage addresses where the word was found (and in some architectures, it also returns the data word, or other associated pieces of data). Thus, a CAM is the hardware embodiment of what, in software terms, could be called an associative array.

Moreover, unlike static random-access memory ("SRAMs"), the CAM memories are mainly used to find the address location of a data word input, either partial or complete match depending on the implementation. CAM memories are performance and area sensitive. A CAM cell may be viewed as an extended SRAM cell with the additional compare function incorporated. In effect, a CAM performs read, write, and search/compare operations. CAM memories are implemented for single-bit compare, dual-bit compare, and multi-bit compare by adding a comparator circuit for each bit compare.

However, one of the challenges of a multi-bit compare CAM cell for static implementation is that multi-bit compare CAM cells are area and power intensive. For example, currently, dual bit compare CAM cells have two sets of comparators, one for each compare data set such as, for example, CMP0_T/CMP0_C and CMP1_C/CMP1_T with true and compliment bits. Each comparator may have 10 transistors leading to a large area footprint. The resulting CAM cell width increases the parasitics and the resistive-capacitive ("RC") delay for the bit line sensing and the compare data inputs.

Current implementations may require TRUE and COMPLEMENT compare data inputs, CMP0_T (true compare data input)/CMP0_C (compliment compare data input) for each set resulting in four metal tracks for a dual bit compare CAM cell. This results in a taller cell that increases the RC delay for the match line generation and the compare data inputs. Further, in a CAM memory containing multi-bit and single bit compare slices, the biggest compare cell sets the overall pitch and the area of the memory array. The single bit compare cell has to be pitch matched to that of the largest cell. As a result, even the single bit compare operation is penalized in performance. Another challenge to CAM cells is that read and write operations in a 6T static random-access memory ("SRAM") storage cell that is part of the CAM cell is also impacted by the larger CAM cell size. This results in degraded read performance due to additional RC delay on the bit lines, increases wire length ("WL") resistance and longer write times and bigger write drivers.

SUMMARY

According to an embodiment of the present disclosure, a method for pre-comparing data in a dual compare content compact, low-leakage multi-bit content-addressable memory (CAM) cell to eliminate a set of compare inputs is provided. A first compare input and a second compare input of a column in a dual compare content addressable memory ("CAM") device. A pre-compare signal is generated based on comparing the first compare input and the second compare input. A first polarity of the first compare input is compared with a first polarity a storage node data. A compare output of the first compare input is generated based on a logic state of the pre-compare signal. A first compare match is generated based on the compare output and a second compare match is generated based on the pre-compare signal.

An embodiment includes a computer system. The computer system includes a processor, a computer-readable memory, and a computer-readable storage device, and program instructions stored on the storage device for execution by the processor via the memory.

An embodiment includes a computer usable program product. The computer usable program product includes a computer-readable storage device, and program instructions stored on the storage device.

BRIEF DESCRIPTION OF THE DRAWINGS

FIG. 10 sets forth a flowchart diagram depicting an additional exemplary method for performing a single-bit compare operation using a content-addressable memory (CAM) Array in a computing environment by a processor in accordance with some embodiments of the present disclosure.

FIG. 12 sets forth a flowchart diagram depicting an additional exemplary method for performing a single-bit compare operation using a content-addressable memory (CAM) Array in a computing environment by a processor in accordance with some embodiments of the present disclosure.

FIG. 13 sets forth an additional block diagram depicting an exemplary dual-bit compare content-addressable memory (CAM) cell having a pre-comparison circuit in accordance with some embodiments of the present disclosure.

FIG. 15 sets forth a table diagram depicting operational results for performing a single-bit compare operation using a content-addressable memory (CAM) Array in a computing environment by a processor in accordance with some embodiments of the present disclosure.

FIG. 16 sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure.

FIG. 17 sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure.

FIG. 18 sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure.

FIG. 19 sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure.

FIG. 20 sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure.

DETAILED DESCRIPTION OF THE DRAWINGS

Figure 1:
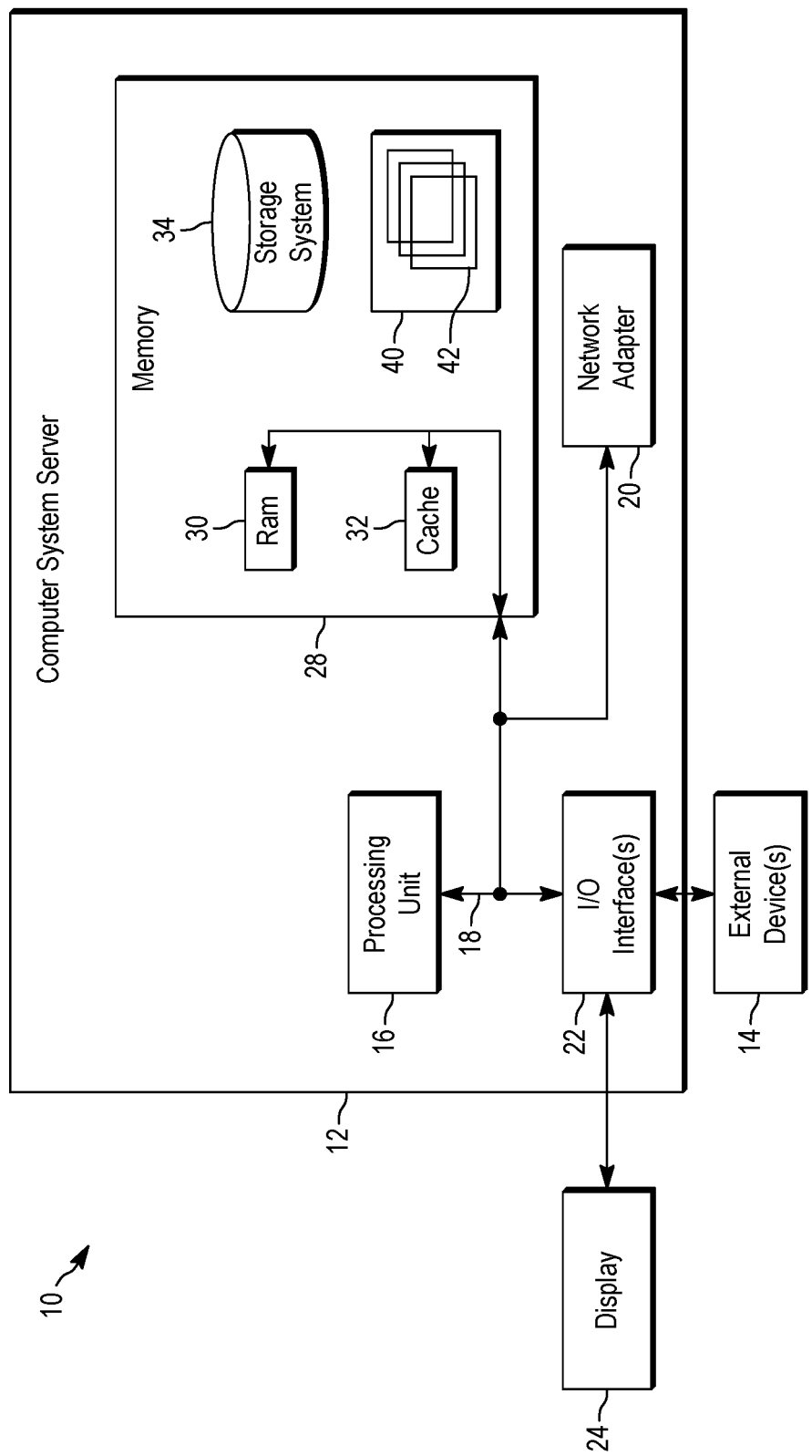
FIG. 1 sets forth a block diagram of an exemplary cloud computing node in accordance with some embodiments of the present disclosure.

Embodiments in accordance with the present disclosure provide a compact, low-leakage multi-bit compare content addressable memory ("CAM") cell. An embodiment is directed to CAM device. The CAM devices includes a transmission gate, having a positive field effect transistor ("PFET") and a negative field effect transistor ("NFET"), configured to compare a compare data input with storage node data having a first logic state. The CAM devices includes a passgate, in communication with the transmission gate, configured to compare the compare data input having a first logic state with the storage node data having a second logic state, wherein the passgate is an n-channel metal oxide semiconductor (NMOS) transistor and controls propagation of the compare data input, and the storage node data of a storage cell is used to control the passgate based on the storage node data. The CAM devices includes a PFET stack, having a first PFET and a second PFET, in communication with the transmission gate and the passgate, configured to compare the compare data input with the storage node data having the second logic state.

In some implementations, the transmission gate is turned on and the PFET stack is turned off for comparing the compare data input based on the storage node data having the first logic state. In some implementations, the transmission gate is turned off and the PFET stack is turned on for comparing the compare data input based on the storage node data having the second logic state.

In some implementations, the passgate is turned on and the second PFET of the PFET stack is turned off for comparing the compare data input based on the compare data input having the first logic state and the storage node data having the second logic state, wherein the passgate passes the second logic state of the storage node data in an output propagation path indicating the compare data input fails to match the storage node data.

In some implementations, the passgate is turned off and the PFET stack is turned on for comparing the compare data input based on the compare data input having the second logic state and the storage node data having the second logic state, wherein the PFET stack indicates the compare data input matches the storage node data.

In some implementations, an output propagation path of the transmission gate is gated through the PFET based upon the compare data input having the first logic state, wherein the first logic state is passed through the output propagation path indicating the compare data input matches the storage node data. In some implementations, an output propagation path of the transmission gate is gated through the NFET based upon the compare data input having the second logic state, wherein the second logic state is passed through the output propagation path indicating the compare data input fails to match the storage node data.

Another embodiment is directed to a system for using a CAM device having one or more comparators. The apparatus comprises a computer processor, a computer memory operatively coupled to the computer processor, the computer memory having disposed therein computer program instructions that, when executed by the computer processor, cause the system to compare a compare data input with storage node data having a first logic state using a transmission gate, having a positive field effect transistor ("PFET") and a negative field effect transistor ("NFET"). The computer program instructions also cause the system to compare the compare data input having a first logic state with the storage node data having a second logic state using a passgate, wherein the passgate is an n-channel metal oxide semiconductor (NMOS) transistor and the storage node data of a storage cell is used to control the passgate based on the storage node data. The computer program instructions also cause the system to compare the compare data input with the storage node data having the second logic state using a PFET stack, having a first PFET and a second PFET.

In some implementations, the transmission gate is turned on and the PFET stack is turned off for comparing the compare data input based on the storage node data having the first logic state, and wherein the transmission gate is turned off and the PFET stack is turned on for comparing the compare data input based on the storage node data having the second logic state, wherein the first logic state is a bit set to a value of 1 and the second logic state is a bet set to a value of zero.

In some implementations, the transmission gate is turned off and the PFET stack is turned on for comparing the compare data input based on the storage node data having the second logic state, wherein the first logic state is a bit set to a value of 1 and the second logic state is a bet set to a value of zero.

In some implementations, the passgate is turned on and the second PFET of the PFET stack is turned off for comparing the compare data input based on the compare data input having the first logic state and the storage node data having the second logic state, wherein the passgate passes the second logic state of the storage node data in an output propagation path indicating the compare data input fails to match the storage node data.

In some implementations, the passgate is turned off and the PFET stack is turned on for comparing the compare data input based on the compare data input having the second logic state and the storage node data having the second logic state, wherein the PFET stack indicates the compare data input matches the storage node data.

The computer program instructions also cause the system to indicate the compare data input matches the storage node data using the PFET of the transmission gate based upon the compare data input having the first logic state and the storage node data having the first logic state; and indicate the compare data input fails to match the storage node data using the NFET of the transmission gate based upon the compare data input having the second logic state and the storage node data having the first logic state.

The computer program instructions also cause the system to indicate the compare data input matches the storage node data using the PFET stack based upon the compare data input having the second logic state and the storage node data having the second logic state; and indicate the compare data input fails to match the storage node data using the passgate based upon the compare data input having the first logic state and the storage node data having the second logic state.

Yet another embodiment is directed to a computer program product for using a CAM device having one or more comparators. The computer program product is disposed upon a computer readable medium and comprises computer program instructions that, when executed, cause a computer to compare a compare data input with storage node data having a first logic state using a transmission gate, having a positive field effect transistor ("PFET") and a negative field effect transistor ("NFET"). The computer program instructions also cause the computer to compare the compare data input having a first logic state with the storage node data having a second logic state using a passgate, wherein the passgate is an n-channel metal oxide semiconductor (NMOS) transistor and the storage node data of a storage cell is used to control the passgate based on the storage node data. The computer program instructions also cause the computer to compare the compare data input with the storage node data having the second logic state using a PFET stack, having a first PFET and a second PFET.

The computer program instructions also cause the computer to indicate the compare data input matches the storage node data using the PFET of the transmission gate based upon the compare data input having the first logic state and the storage node data having the first logic state; and indicate the compare data input fails to match the storage node data using the NFET of the transmission gate based upon the compare data input having the second logic state and the storage node data having the first logic state.

The computer program instructions also cause the computer to indicate the compare data input matches the storage node data using the PFET stack based upon the compare data input having the second logic state and the storage node data having the second logic state; and indicate the compare data input fails to match the storage node data using the passgate based upon the compare data input having the first logic state and the storage node data having the second logic state.

In some implementations, the transmission gate is turned on and the PFET stack is turned off for comparing the compare data input based on the storage node data having the first logic state, and wherein the transmission gate is turned off and the PFET stack is turned on for comparing the compare data input based on the storage node data having the second logic state, wherein the first logic state is a bit set to a value of 1 and the second logic state is a bet set to a value of zero.

It is understood in advance that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the disclosure described herein. Regardless, cloud computing node 10 is capable of being implemented and performing any of the functionality set forth hereinabove.

In cloud computing node 10 there is a computer system/server 12, which is operational with numerous other general purpose or special purpose computing system environments or configurations. Examples of well-known computing systems, environments, and configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory ("RAM") 30 and cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the disclosure.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and methodologies of embodiments of the disclosure as described herein.

Computer system/server 12 may also communicate with one or more external devices 14 such as a keyboard, a pointing device, a display 24, etc.; one or more devices that enable a user to interact with computer system/server 12; and any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and a public network (e.g., the Internet) via network adapter 20. As depicted, network adapter 20 communicates with the other components of computer system/server 12 via bus 18. It should be understood that although not shown, other hardware and software components could be used in conjunction with computer system/server 12. Examples, include, but are not limited to: microcode, device drivers, redundant processing units, external disk drive arrays, RAID systems, tape drives, and data archival storage systems, etc.

Figure 2:
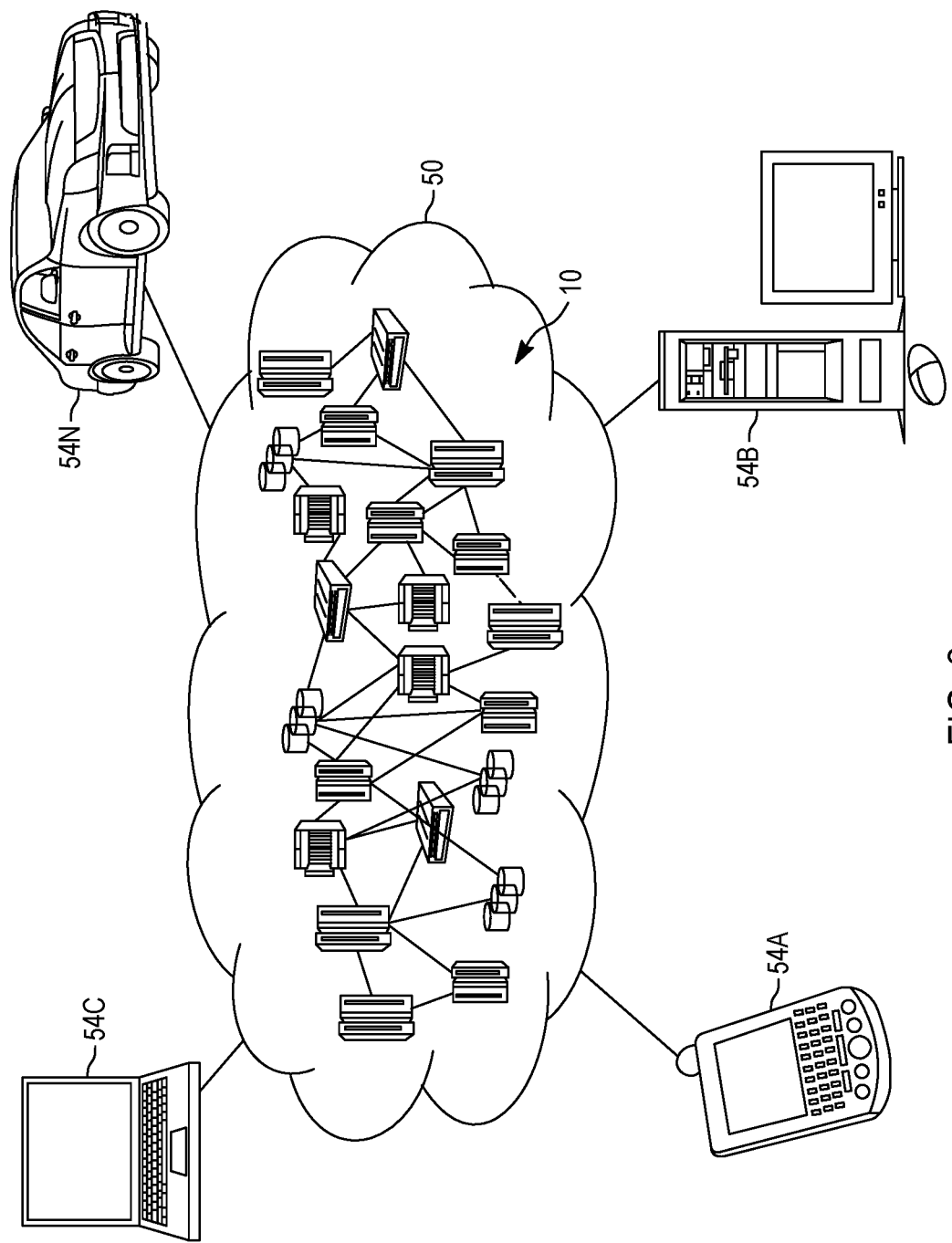
FIG. 2 sets forth a cloud computing environment in accordance in accordance with some embodiments of the present disclosure.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and network addressable connection (e.g., using a web browser).

Figure 3:
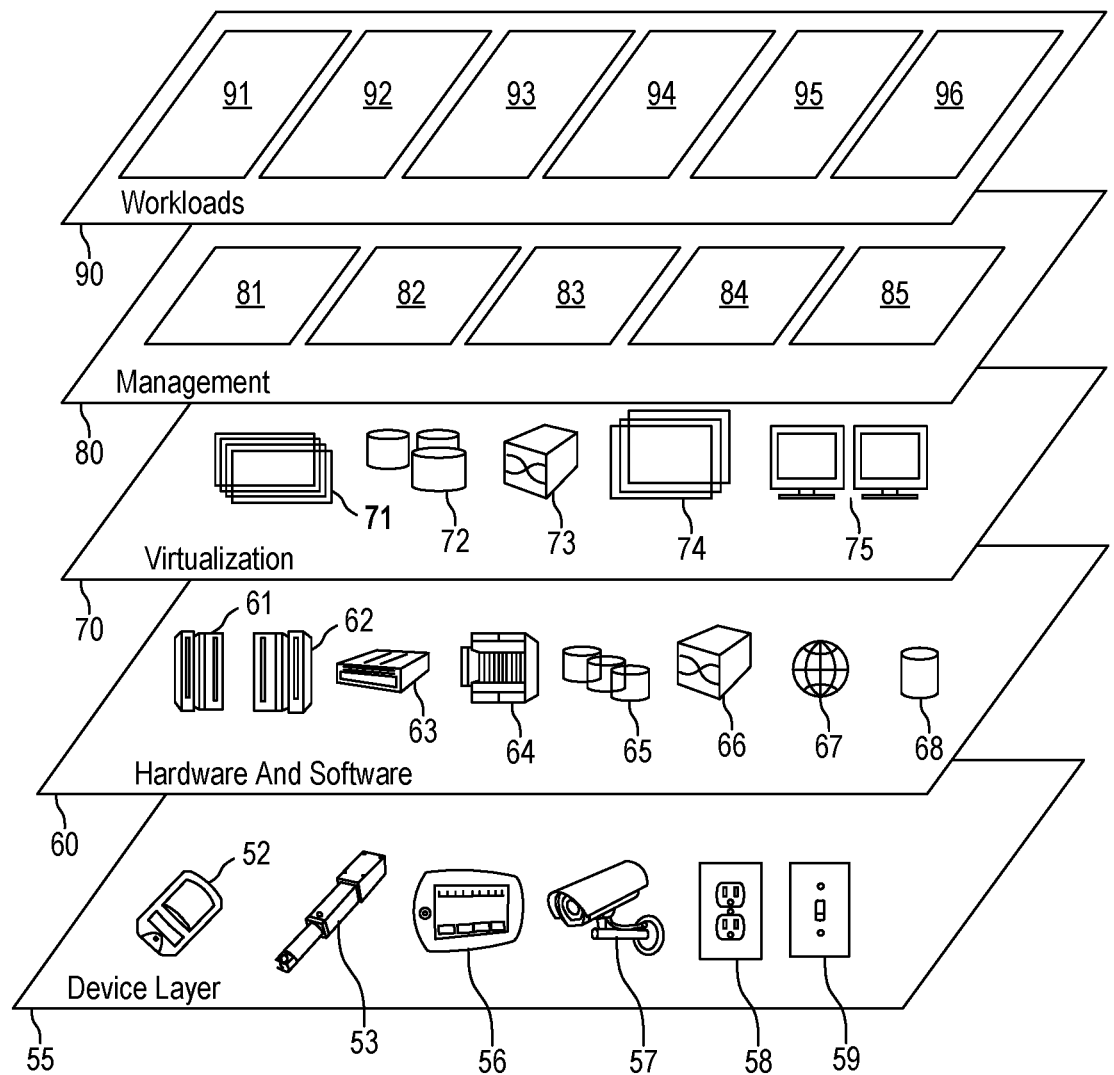
FIG. 3 sets forth abstraction model layers in accordance in accordance with some embodiments of the present disclosure.

Referring now to FIG. 3, a set of functional abstraction layers provided by cloud computing environment 50 (FIG. 2) is shown. It should be understood that the components, layers, and functions shown in FIG. 3 are intended to be illustrative only and embodiments of the disclosure are not limited thereto. As depicted, the following layers and corresponding functions are provided:

Device layer 55 may include physical devices, virtual devices, or a combination of physical and virtual devices embedded with standalone electronics, sensors, actuators, and other objects to perform various tasks in a cloud computing environment 50. Each of the devices in the device layer 55 incorporates networking capability to other functional abstraction layers such that information obtained from the devices may be provided thereto, and information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote-control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present disclosure, various workloads and functions 96 for using a CAM device in a computing environment. In addition, workloads and functions 96 for using a CAM device may include such operations as, read, write, storing, and comparing (e.g., comparing input compare bits and storage node data), and as will be further described, user and device management functions. One of ordinary skill in the art will appreciate that the workloads and functions 96 for using a CAM device may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present disclosure.

Figure 4:
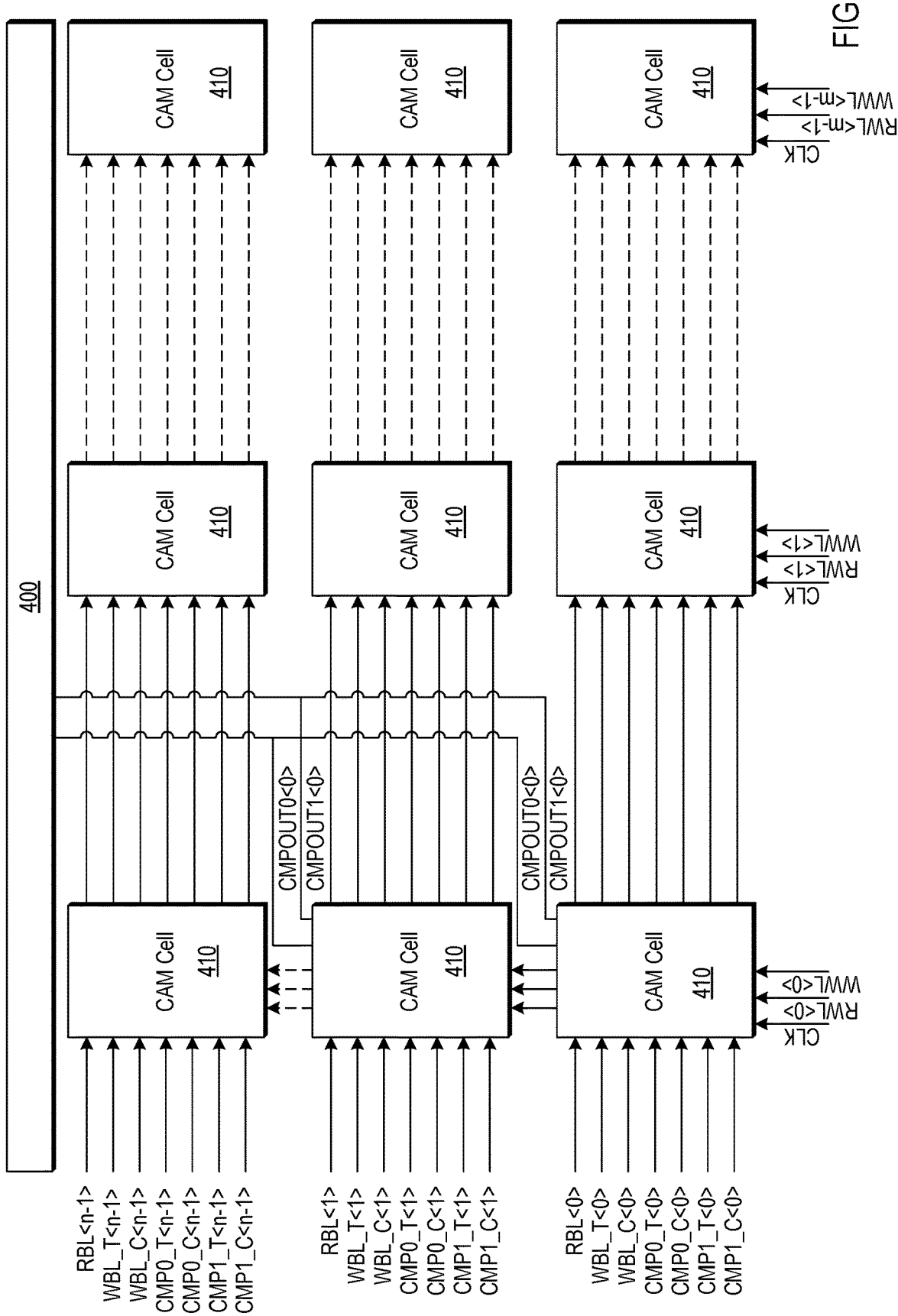
FIG. 4 sets forth an additional block diagram depicting an exemplary content-addressable memory (CAM) Array in accordance with some embodiments of the present disclosure.

Turning now to FIG. 4, an exemplary CAM array 400 comprising multiple CAM cells. In one aspect, one or more of the components, modules, services, applications, and functions described in FIGS. 1-3 may be used in FIG. 4. As will be seen, many of the functional blocks may also be considered "modules" or "components" of functionality, in the same descriptive sense as has been previously described in FIGS. 1-3.

The CAM array 400 may be used for various purposes in which quick searching of multiple entries is desirable. For example, CAM arrays may be used to provide address translation or address resolution, such as for cache accesses. The CAM cells 110 of the CAM array 400 may be single-bit compare, dual-bit compare, and multi-bit compare functionality. For illustrative purposes only, each of the CAM cells 110 of the CAM array 400 may be an m×n multi-bit CAM memory, where m and n are positive integers. That is, the CAM array 400 is a particular type of that is used to compare the data stored with m×n multiple compare inputs (e.g., m×n multi-compare bits) into each of the CAM cells 110. That is, CAM array 400 is an array with m entries and n columns or bits, and m number of match signals are generated.

The CAM array 400 may be arranged as an array in rows and columns. The rows of the CAM array 400 may sometimes be referred to as "word lines." The CAM cells 110 may have a read bit line (RBL) (into a single read port), write bit lines (WBL) such as, for example, true and compliment WBL (e.g., WBL_T and WBL_C), one or more compare (CMP) bit lines such as, for example, pairs of compare inputs such as, for example, true and compliment compare inputs (e.g., CMP0_T, CMP_C (a first pair) and CMP1_T, CMP1_C (a second pair)) for a dual bit compare. It should be noted that CAM array 400 is a dual bit compare but may be extended to a multi-bit compare CAM array.

Said differently, the CMP0_T and CMP0_C are the TRUE and COMPLEMENT Compare data input for set 1, and CMP1_T, CMP1_C are the TRUE and COMPLEMENT Compare data input set 2. A Single bit compare cell returns the result of matching the single compare data input such as, for example, CMP0_T/CMP0_C with the stored data in the storage node. A Dual bit compare cell compares each compare data input, CMP0_T/CMP0_C and CMP1_T/CMP1_C with the stored data in the storage node.

The CAM cells 110 in a particular column may be connected to one another by search lines. A clock (clk) may synchronize the generation of the read word lines (RWL) and the write word lines (RWL) for each of the CAM cells 110. The compare output lines (CMPOUT) for each of the CAM cells 110 in a given row may be combined to generate a match or "hit" signal such as, for example, CMPOUT0, CMPOUT1 from the CAM array 400. For example, CMPOUT1 is showing the comparison of the same data written by the WWL with the CMP1_T and the CMP1_C (e.g., the true and compliment compare inputs) coming into the CAM cells 410.

Figure 5:
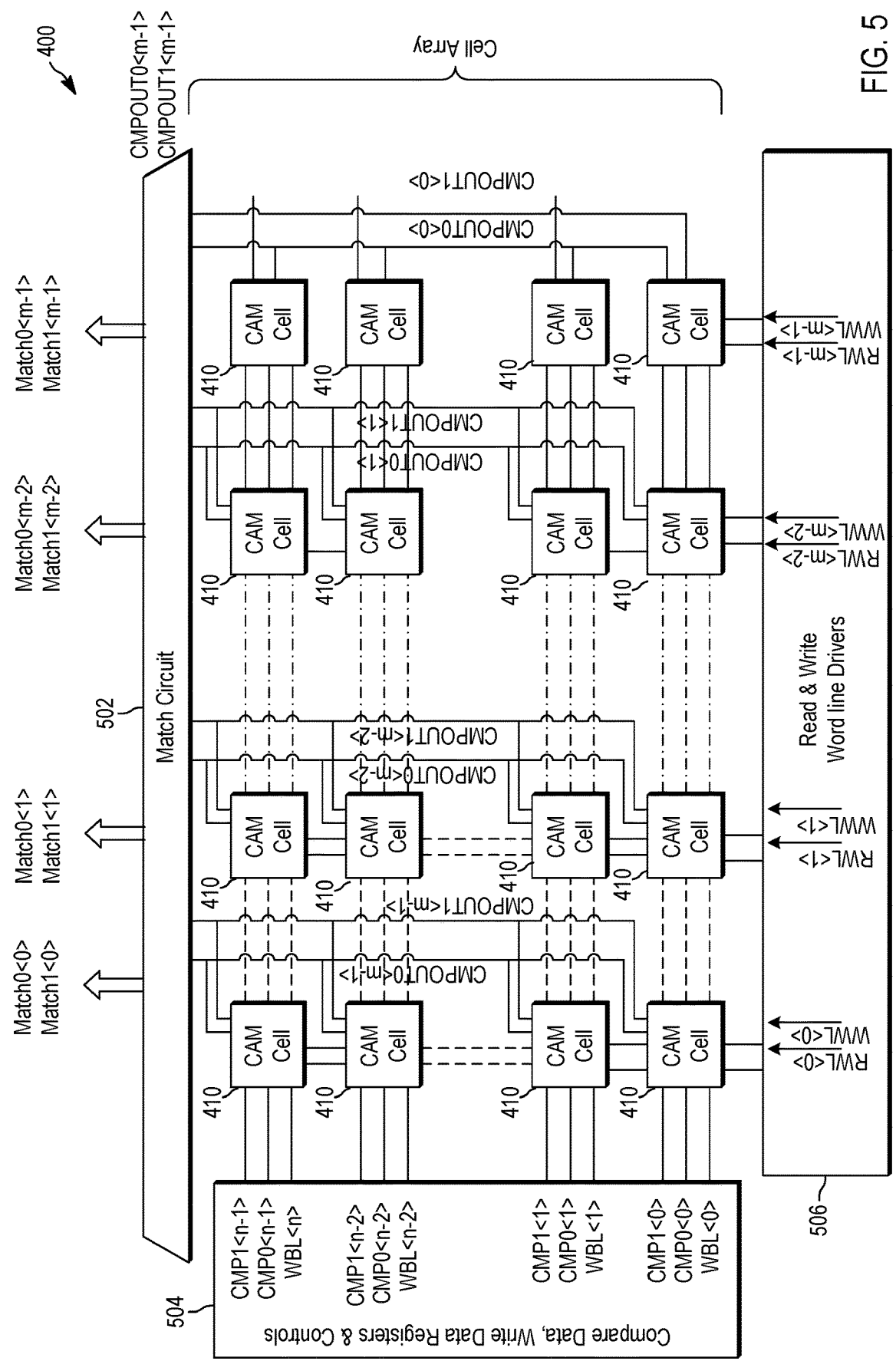
FIG. 5 sets forth an additional block diagram depicting an exemplary dual-bit compare content-addressable memory (CAM) Array in accordance with some embodiments of the present disclosure.

For further explanation, FIG. 5 sets forth an additional block diagram depicting an exemplary dual-bit compare content-addressable memory (CAM) Array 400 in accordance with some embodiments of the present disclosure. As will be seen, many of the functional blocks may also be considered "modules" of functionality, in the same descriptive sense as has been previously described in FIGS. 1-4. Repetitive description of like elements employed in other embodiments described herein is omitted for sake of brevity.

The CAM array 400 is depicted with dual-bit CAM cells 410 each containing a read/write memory cell and a compare port for each compare bit. The CAM array 400 may have a dual-bit CAM port to compare two sets of incoming compare inputs to the stored data.

The CAM array 400 is depicted with registers and controls 504 for the compare data (CMP) with the true and compliment, and the write data (WBL). The CAM array 400 may also have one or more drivers such as, for example, the read and write word line drivers 506. The compare logic of the dual-bit CAM cells 410 determines a state of the compare output such as, for example, the CMPOUT0 and CMPOUT1 for each entry. Any time the stored data or the incoming compare inputs change, the CMPOUT0, CMPOUT1 from the CAM cells 410 changes. The CMPOUT0, CMPOUT1 from each of the 'n' CAM cells 410 in a row are combined in the match circuit 502 to generate the hit or match signal for the entry/row such as, for example, the match0 and match1.

Figure 6:
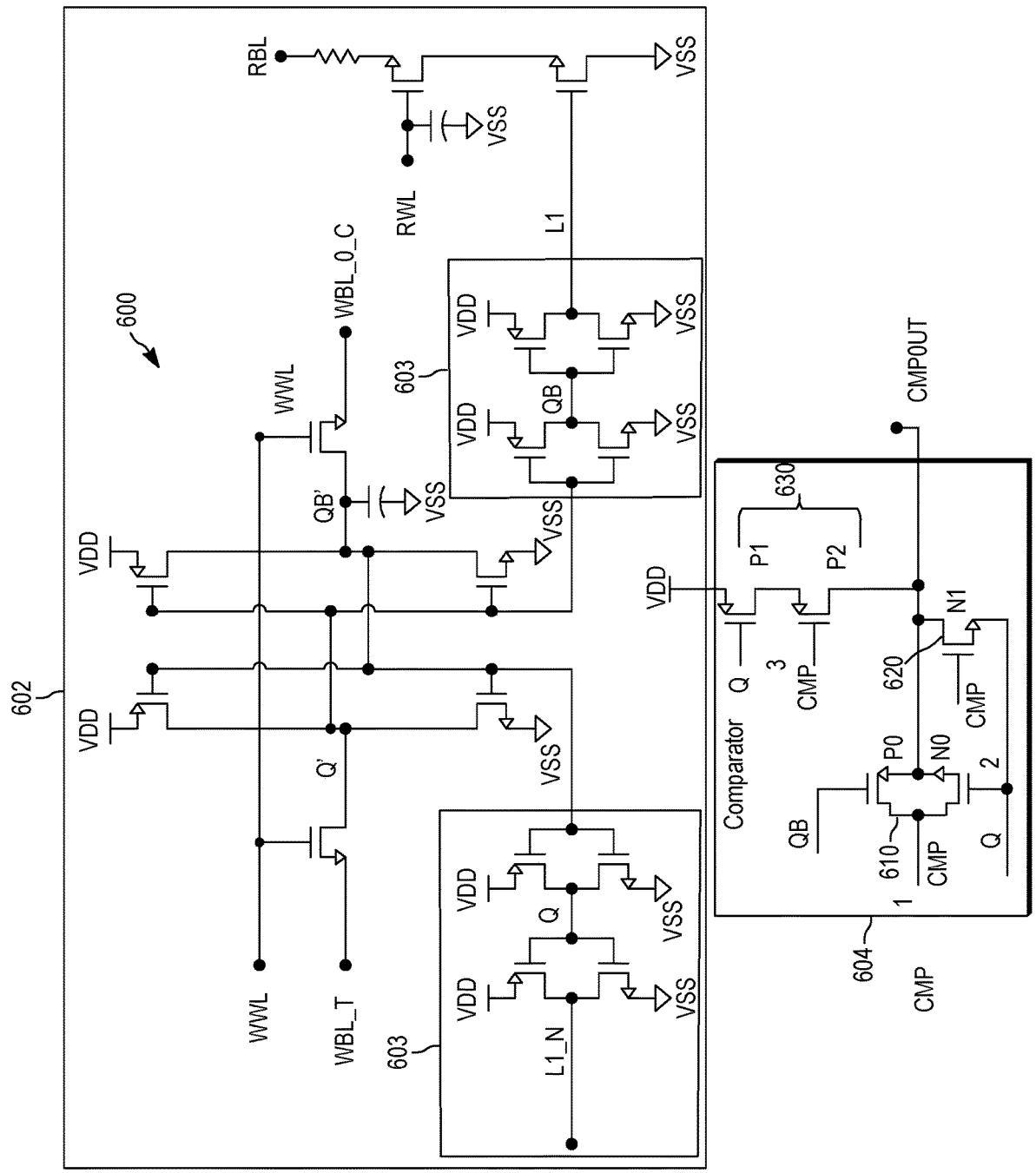
FIG. 6 sets forth an additional block diagram depicting an exemplary single-bit compare content-addressable memory (CAM) cell in accordance with some embodiments of the present disclosure.

For further explanation, FIG. 6 sets forth an additional block diagram depicting an exemplary single-bit compare content-addressable memory (CAM) cell 600 (e.g., a 1-bit compare CAM cell) in accordance with some embodiments of the present disclosure. As depicted, the CAM cell 600 may include three primary functional components. In some embodiments, the CAM cell 600 may include a comparator 604. The comparator 604 may be in communication with a storage system such as, for example a read/write SRAM storage cell 602. It should be noted that the SRAM storage cell 602 may be one of a plurality of SRAM storages cells arranged in one of a plurality of designs and configurations for the CAM cell 600. The CAM cell 600 functions on the premise that the stored date in the SRAM storage cell 602 is constant and may be used to drive the compare operations of the comparator 604 (and optionally the comparator 606 of FIG. 7). The CAM cell 600 provides an enhanced gating function by utilizing existing storage nodes of the SRAM storage cell 602 for the comparator functions (e.g., comparator functions of the comparator 604). In this way, the CAM cell 600 ensures the transmission gate 610 transfers the appropriate logic state levels (high "1" or low "0") such as, for example, the high "1" through the PFET of the transmission gate 610 and the low "0" through the NFET of the transmission gate 610 thereby maintaining signal strength and output.

Also, as used herein, for illustrative purposes only, the following symbols may be used in FIG. 6. WWL is a write word line (input), RWL is a read wordline (input), WBL_T is a write data input true (input), and WBL_C is write data input compliment (input). Also, CMP represents a compare input to the CAM cell 600 (input), and CMPOUT is compare output from the CAM cell 600. Q' is the true stored node and QB' is the compliment stored node. Q is the true stored data and QB' is the compliment stored data (where (where Q is similar to Q' and QB is similar to QB'). VDD is a power line and Vss is a ground potential line.

Figure 7:
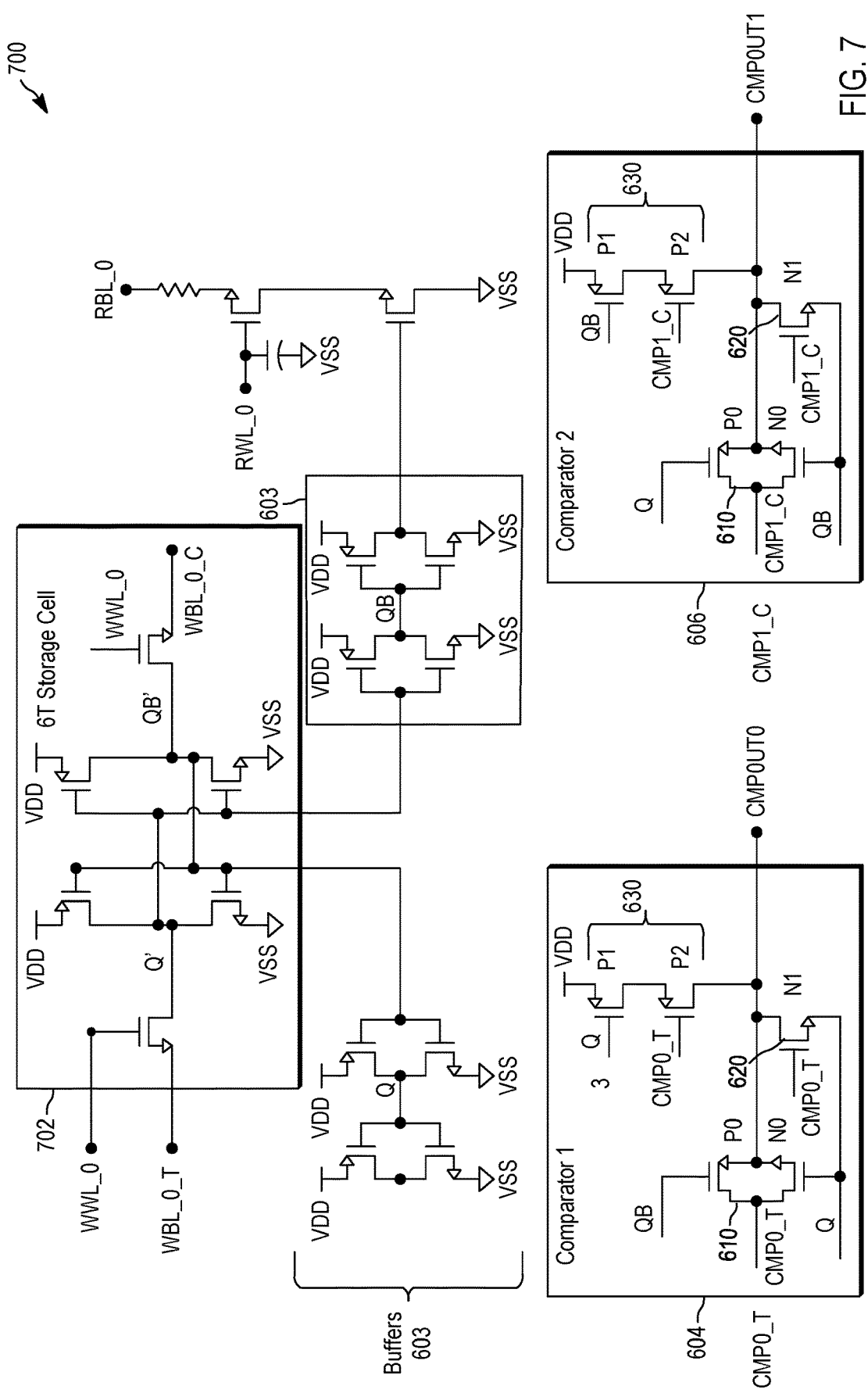
FIG. 7 sets forth an additional block diagram depicting an exemplary dual-bit compare content-addressable memory (CAM) cell in accordance with some embodiments of the present disclosure.

The SRAM cell 602 may include a smaller number of transistors such as, for example, a 6T SRAM as further depicted in FIG. 7, and is capable of storing a voltage value therein. The WWL is used to write the values of the write bit line (e.g., WBL_T) and the WBL compliment (e.g., the WBL_C) into the SRAM cell 602. A read word line ("RWL0") is used to read the content of the SRAM cell 602 on the RBL. In some embodiments, a voltage value may represent a corresponding binary logical data bit value (e.g., a "low" or "0" value, and a "high" or "1" value).

The comparator 604 may include a transmission gate 610 (e.g., a transmission gate circuit), having a positive field effect transistor ("PFET") (depicted as P0 in FIG. 6) and a negative field effect transistor ("NFET") (depicted as N0 in FIG. 6), configured to compare a compare data input with a storage node data having a first logic state of the SRAM storage cell 602. The comparator 604 may include a passgate 620 (depicted also as N1 in FIG. 6), in communication with the transmission gate 610, configured to compare the compare data input having a first logic state with the storage node data having a second logic state in the SRAM storage cell 602. The passgate 620 is an n-channel metal oxide semiconductor (NMOS) transistor and controls propagation of the compare data input, and the storage node data of a storage cell is used to control the passgate based on the storage node data of the SRAM storage cell 602.

The comparator 604 may include a PFET stack 630, having a first PFET (P1) and a second PFET (P2), in communication with the transmission gate 610 and the passgate 620, is configured to compare the compare data input with the storage node data having the second logic state of the SRAM storage cell 602.

In some embodiments, the CAM cell 600 is an enhanced CAM cell designed to reduce the number of transistors (e.g., reduce the transistor count) using only a single compare data input (e.g., "CMP") and uses existing data storage nodes in the SRAM storage cell 602 to gate the passgate control of the passgate 620. This is so that the stored data, in the SRAM storage cell 602, that is compared for each compare (e.g., true compare and compliment compare) is the same. The passgate 620 for the comparator 604 may be controlled by the stored node data input and only one storage node is turned ON at a given time. This reduces the load on the Q/QB storage nodes.

Furthermore, the transmission gate 610 (e.g., P0/N0) and the PFET stack 630 (e.g., P1/P2) are mutually exclusive, ie., only one on them is turned ON based on the storage data node 'Q'/'Q' state of the SRAM cell 602. The output propagation path through the PFET stack 630 or the passgate 620 (e.g., an NFET passgate N1) is gated by the Compare data input condition.

Thus, in some embodiments, the transmission gate 610 is turned on and the PFET stack 630 is turned off for comparing the compare data input based on the storage node data having the first logic state. By way of example only, a first logic state is equal to a "high" or "1" value and a second logic state is equal to a "low" or "0" value.

In some embodiments, the transmission gate 610 transmission gate is turned off and the PFET stack 630 is turned on for comparing the compare data input based on the storage node data having the second logic state (e.g., a "low" or "0" value).

In some embodiments, the passgate 620 (e.g., an NFET passgate N1) is turned on and the second PFET (P2) of the PFET stack 630 is turned off for comparing the compare data input based on the compare data input having the first logic state (e.g., a "high" or "1" value) and the storage node data having the second logic state (e.g., a "low" or "0" value). The passgate 620 (e.g., an NFET passgate N1) passes the second logic state (e.g., a "low" or "0" value) of the storage node data in an output propagation path indicating the compare data input (CMP) fails to match the storage node data.

In some embodiments, the passgate 620 is turned off and the PFET stack 630 is turned on for comparing the compare data input based on the compare data input (CMP) having the second logic state (e.g., a "low" or "0" value) and the storage node data having the second logic state (e.g., a "low" or "0" value). The PFET stack 630 indicates the compare data input matches the storage node data.

In some embodiments, an output propagation path of the transmission gate 610 is gated through the PFET (P0) of the transmission gate 610 based upon the compare data input having the first logic state (e.g., a "high" or "1" value). The first logic state (e.g., a "high" or "1" value) is passed through the output propagation path of the PFET (P0) indicating the compare data input matches the storage node data.

In some embodiments, an output propagation path of the transmission gate is gated through the NFET (N0) of the transmission gate 610 based upon the compare data input having the second logic state (e.g., a "low" or "0" value). The second logic state (e.g., a "low" or "0" value) is passed through the output propagation path of the NFET (N0) indicating the compare data input fails to match the storage node data.

In some embodiments, an output propagation path of the compare data input passes through the PFET stack 630 based upon the compare data input having the first logic state (e.g., a "high" or "1" value) indicating the compare data input matches the storage node data.

Thus, as depicted in FIG. 6, when the compare input, CMP, is asserted there are 3 different propagation paths in the comparator 604. The comparator 604 uses CMOS gate properties to determine the propagation path in order to maintain a desired degree of signal integrity. In some embodiments, the transmission gate 610 uses the PFET (P0) and NFET (N0) to compare the compare input, CMP, when the stored data, Q, is '1' HIGH (e.g., Q is 1 and QB is equal to 0). In some embodiments, the passgate 620 (e.g., an NMOS passgate, N1) is used to compare when the compare input CMP is equal to 1 (e.g., CMP=1) and the stored data Q is equal to zero (e.g., Q=0). In some embodiments, the PFET stack 630, having the first PFET (P1) and the second PFET (P2) is used to compare the compare input CMP=0 with the stored data Q=0 It must be noted that the Transmission gate P0/N0 and PFET stack P1/P2 are mutually exclusive, ie., only one on them is turned ON based on the data node 'Q'/'Q' state. The output propagation path through the PFET stack 630 or the passgate 620 (e.g., an NMOS passgate, N1) is gated by the compare data input condition.

The CAM cell 600 thereby reduces the transistor count leading to smaller area and lower static leakage (e.g., current leakage) by using half the number of transistors such as, for example, only five transistors for the compare function of the comparator 604 as compared to 0 transistors used in current CAM cells. By using only five transistors, the CAM cell 600 removes half of the metal tracks without compromising the CAM cell 600 drive strength and cell integrity and reliability. Moreover, the comparator 604, when employing comparator functions, uses an existing storage nodes such as, for example, the read/write SRAM cell 602 to facilitate the comparison without requiring any changes to the storage cell. In some embodiments, the read/write functions of the SRAM cell 602 is not impacted by the comparator 604 and there are no changes to the address decode and data input circuitry.

For further explanation, FIG. 7 sets forth an additional block diagram depicting an exemplary dual-bit compare content-addressable memory (CAM) cell in accordance with some embodiments of the present disclosure. Repetitive description of like elements employed in other embodiments described herein is omitted for sake of brevity.

FIG. 7 depicts a dual bit CAM cell 700, which may be an SRAM Cell. The dual-bit CAM cell 700 may include a 6T SRAM cell 704 and multiple comparators such as, for example, comparator 604 (e.g., comparator 1) and comparator 606 (e.g., comparator 2). The comparator 604 and comparator 606 may be in communication with a storage system such as, for example the SRAM cell (e.g., a 6T SRAM storage cell).

In some embodiments, the storage data nodes in the 6T SRAM storage cell 702 are used for gating the compare passgate such as, for example, the passgate 620 (e.g., an NMOS passgate, N1). The buffered version, included in buffers 603, in FIG. 7, is an inverted output of Q' and QB', such as, for example, the QB and Q, respectively, which are used to isolate the storage node from the search/compare function.

The compare function operations of the comparator 604 and comparator 606 requires only one polarity (e.g., logic state) of the CMP0 and CMP1 signals for each compare bit, thus requiring only one polarity of the compare data input (CMP) to be routed through a column slice. This eliminates two routing tracks from the current design, which requires both true and complement for each compare data input set. In FIG. 7, the compare input, CMP, may be exchanged/swapped with CMP0_C and CMP1_T. Additionally, to minimize the loads on the true and compliment (e.g., each CMP0_C and CMP1_T), a column slice of the dual-bit CAM cell 700 may use opposite polarity from its neighbor column.

In some embodiments, comparator 606 circuitry has the same functionality as comparator 604. In some embodiments, the two comparator 604 and comparator 606 circuits operate in parallel comparing their input compare bits CMP0_T or CMP1_T to the common stored data Q. The input connection to comparator 606 may be exchanged and swapped from that of comparator 604 thereby extending the range of possibilities to balance the routing tracks and loading effect on the input signals such as, for examples, the WWL, the RWL, the WBL_T (e.g., true write bit line), the WBL_C (e.g., complement write bit line), and the compare input (CMP).

The reduced number of transistors of the SRAM cell 602 may reduce current leakage, particularly at the word-line transistor gates and the bit-line transistor gates. Thus, using the comparator 604, the 6T SRAM cell 702, which may require a constant power level both to maintain the data bit stored in an SRAM latch and allow a reading from and the writing to of data, the current leakage decreases as the power used by the array of SRAM cells is decreased. Said differently, current leakage decreases since the comparators 604, and optionally the comparator 606, is reduced in both directions due to reduced transistor count in the comparator and elimination of 1 metal track per bit of comparison.

This will result in overall CAM array (e.g., CAM Array 400) size reduction. The CAM array leakage will be reduce by more than half due to fewer transistors and the complementary nature of the comparator 604 and comparator 606, while allowing a fully parallel compare. The reduced cell tracks enable lower wire resistance for the "matchlines" and "wordlines" thereby improving the performance. The reduced CAM cell 600 width provides for lower RC on the compare (CMP) inputs and bitelines (BL) to improve BL sense and write time. In some embodiments, the smaller 6T SRAM storage cell 702 may also lower the data driver sizes and compare input buffers 603. The smaller 6T SRAM storage cell 702 size enables efficient pitch matching with single bit compare cells in the same array.

Figure 8:
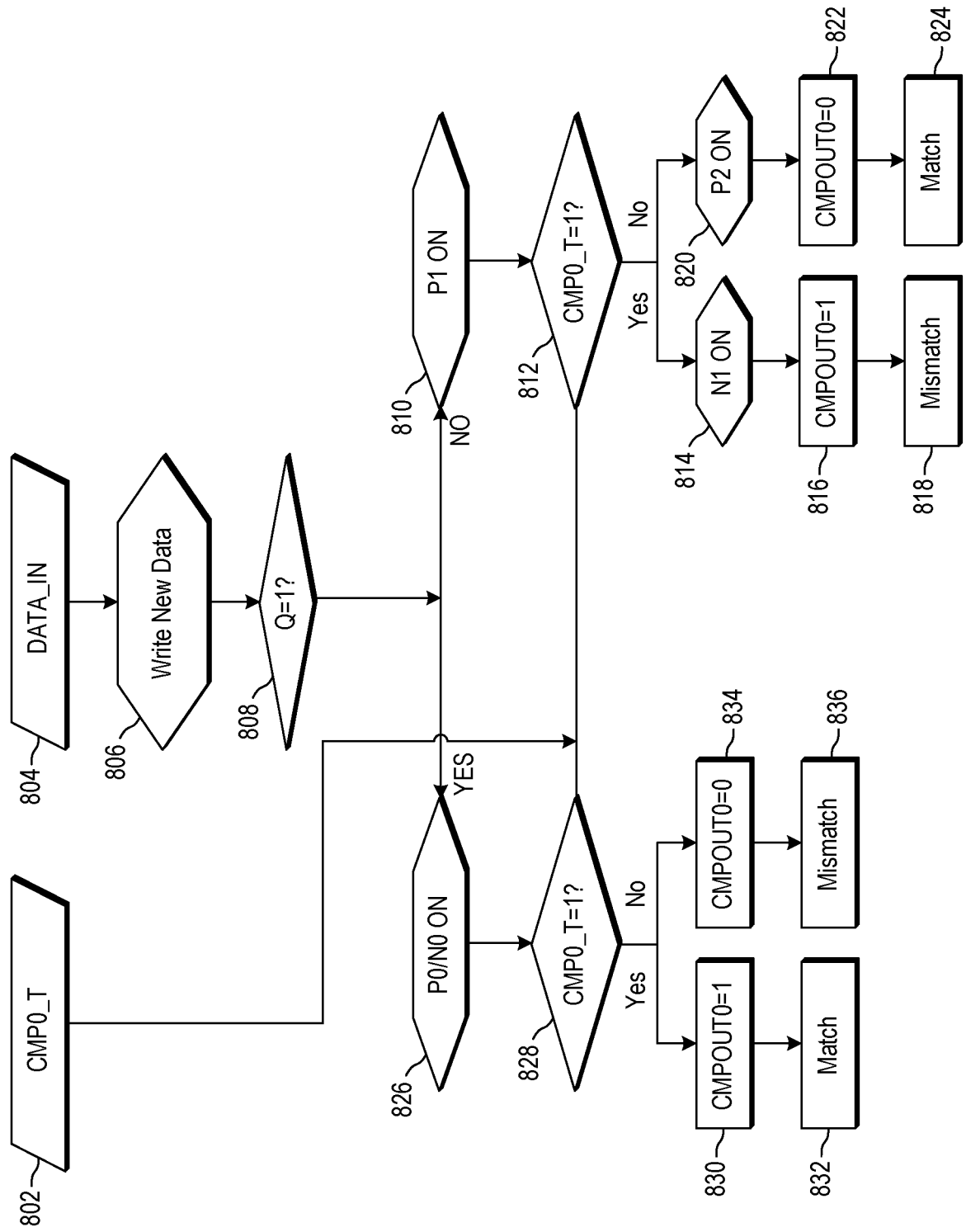
FIG. 8 sets forth a flowchart diagram depicting an exemplary method for performing a single-bit compare operation using a content-addressable memory (CAM) Array in accordance with some embodiments of the present disclosure.

For further explanation, FIG. 8 sets forth a flowchart diagram depicting an exemplary method for performing a single-bit compare operation using a content-addressable memory (CAM) Array in accordance with some embodiments of the present disclosure. The functionality 800 may be implemented as a method (e.g., a computer-implemented method) executed as instructions on a machine, where the instructions are included on at least one computer readable medium or one non-transitory machine-readable storage medium.

The functionality 800 may be implemented as a method (e.g., a computer-implemented method) executed as instructions on a machine, where the instructions are included on at least one computer readable medium or one non-transitory machine-readable storage medium. FIG. 8 also illustrates the operations for a comparator (e.g., comparator 604) for a single bit compare such as, for example, as described in FIG. 6. The operations for a comparator of FIG. 8 may be extended and applied to the comparator 606 of FIG. 7.

Starting in block 804, new data may arrive and the new data may be written, as in block 806. A determination operation is performed to determine whether the new data written is 1 (a first logic state level of the storage node data Q), as in block 808.

If yes at block 808 (where the storage node data Q is equal 1, the transmission gate (having P0 and N0) in the comparator 604 may be turned on, as in block 826. It should be noted that in this first case (e.g., the storage node data Q is equal to high ("1"), Q' and Q are equal to high ("1") and QB' and QB are both equal to low ("0"). The PFET stack 630 may be turned off since the transmission gate 610 is mutually exclusive with the PFET stack 630.

An incoming compare data input 'CMP' (e.g., CMP0_T true) may be received, as in block 802, and a determination is made to determine whether or not the compare data input 'CMP' is equal to high ("1"), as in block 828. If the incoming compare data input "CMP" is "1," at block 828, the PFET stack 630 (having PFET P1 and PFET P2) is OFF and the PFET P0 of the transmission gate 610 passes the CMP to output, CMPOUT 830, to high ("1") indicating a hit or match, as in block 832.

Alternatively, if the incoming compare data input "CMP" is "0," at block 828, the passgate 602 (depicted also as N1 in FIG. 6) is cutoff and the NFET (N0) of the transmission gate 610 passes the CMP to output, CMPOUT 834, to low ("0") indicating a mismatch (e.g., no hit), as in block 836.

Returning to block 808, if the new data written is 0 (a second logic state level of the storage node data Q), the transmission gate 610 (having P0/N0) are turned off and the PFET stack 630 (e.g., PFET P1) is turned on, as in block 810. It should be noted that in this second case (e.g., the c is equal to low ("0"), Q' and Q are equal to low ("0") and QB' and QB are both equal to high ("1").

An incoming compare data input 'CMP' (e.g., CMP0_T true) may be received, as in block 802, and a determination is made to determine whether the compare data input 'CMP' is equal to high ("1"), as in block 812. If the incoming compare data input "CMP" is equal to high ("1"), at block 812, the passgate 620 (e.g., an NFET passgate N1) is turned ON and the second PFET (P2) of the PFET stack 630 is turned off, as in block 814. The passgate 620 (e.g., an NFET passgate N1) passes the storage data node Q to the output CMPOUT (e.g, CMPOUT0=1 at block 816) having the second logic state high ("1") indicating a match, as in block 818.

If the incoming compare data input "CMP" is equal to low ("0"), at block 812, the second PFET (P2) of the PFET stack 630 is turned on and the passgate 620 (e.g., an NFET passgate N1) is turned off, as in block 820. The PFET stack 630 pulls the output CMPOUT, having the second logic state (e.g., low/"0"), as in block 822, and the output CMPOUT indicates a match, as in block 824.

It should be noted that the operations of FIG. 8 may be applied for the comparator 606 of FIG. 7. The passgate 620 of the comparator 604 and the passgate 620 of the comparator 606 are mutually exclusive such that, for example, only one on them is turned ON based on the data node Q' or) state. The output propagation path through the PFET stack or the NFET pulldown N2 is gated by the Compare data input condition.

Figure 9:
FIG. 9 sets forth a table diagram depicting operational results for performing a single-bit compare operation using a content-addressable memory (CAM) Array in a computing environment by a processor in accordance with some embodiments of the present disclosure.

For further explanation, FIG. 9 sets forth a table 900 depicting operational results for performing a single-bit compare operation using a content-addressable memory (CAM) Array in a computing environment by a processor in accordance with some embodiments of the present disclosure. The table 900 illustrates, by way of example only, the functionality of the comparators 604 of FIG. 6, and optionally comparator 606 of FIG. 7. Also, it should be noted that the stored data has a first logic state of high ("1"), the QB is equal to 1, the CMP is equal to 0, and Q is equal to 1.

Table 900 depicts rows and columns where the compare outputs (CMP0_OUT and CMP1 OUT) for various stored data and compare input conditions. For example, the results (e.g.) of the first row indicate a mismatch for the CMP0 (CMP0 OUT) and the CMP1 (CMP1_OUT) compare outputs when the Q' is equal to high ("1"), and QB' is equal to low ("0"), the CMP0_T is equal to low ("0"), the CMP1_T is equal to low ("0"). Alternatively, the results (e.g.) of the second row indicate a hit or "match" for the CMP1 (CMP1 OUT) compare output and a mismatch for the CMP0 (CMP0_OUT) compare output when the RFL1 is equal to high ("1"), Q is equal to high ("1"), and QB is equal to low ("0"), the CMP0_T is equal to low ("0"), the CMP1_T is equal to high ("1"). Similarly, each successive row depicts the results for the various stored data and compare input conditions.

For further explanation, FIG. 10 sets forth a flowchart diagram depicting an additional exemplary method for performing a single-bit compare operation using a content-addressable memory (CAM) Array in a computing environment by a processor in accordance with some embodiments of the present disclosure. The example method of FIG. 10 includes comparing 1010 a compare data input with storage node data having a first logic state using a transmission gate, having a positive field effect transistor ("PFET") and a negative field effect transistor ("NFET"). The example method of FIG. 10 also includes comparing 1020 the compare data input having a first logic state with the storage node data having a second logic state using a passgate, wherein the passgate is an n-channel metal oxide semiconductor (NMOS) transistor and the storage node data of a storage cell is used to control the passgate based on the storage node data. The example method of FIG. 10 also includes comparing 1030 the compare data input with the storage node data having the second logic state using a PFET stack, having a first PFET and a second PFET.

Figure 11:
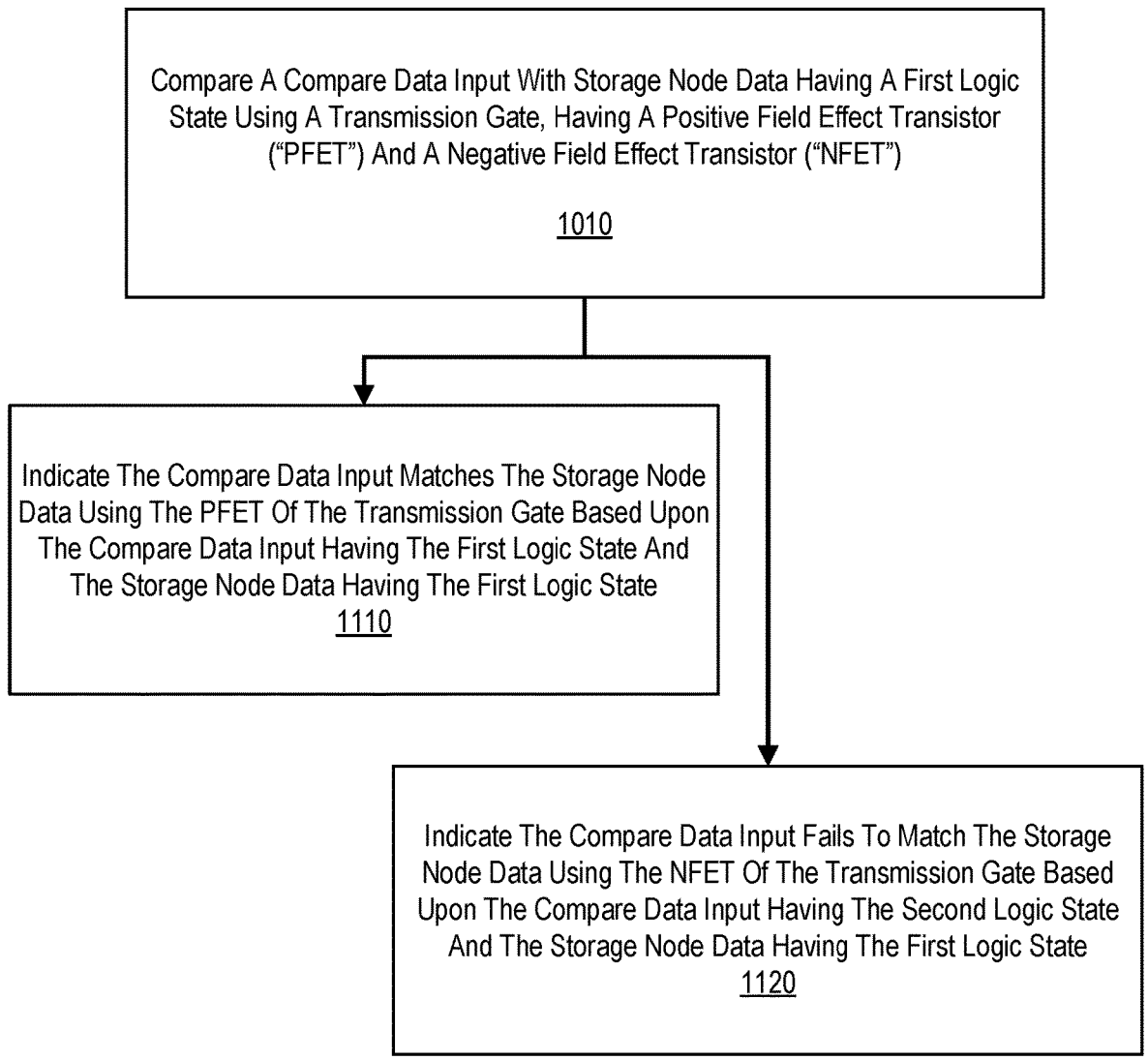
FIG. 11 sets forth a flowchart diagram depicting an additional exemplary method for performing a single-bit compare operation using a content-addressable memory (CAM) Array in a computing environment by a processor in accordance with some embodiments of the present disclosure.

For further explanation, FIG. 11 sets forth a flowchart diagram depicting an additional exemplary method for performing a single-bit compare operation using a content-addressable memory (CAM) Array in a computing environment by a processor in accordance with some embodiments of the present disclosure. Like the example method of FIG. 10, the example method of FIG. 11 also includes comparing 1010 a compare data input with storage node data having a first logic state using a transmission gate, having a positive field effect transistor ("PFET") and a negative field effect transistor ("NFET").

The example method of FIG. 11 also includes indicating 1110 the compare data input matches the storage node data using the PFET of the transmission gate based upon the compare data input having the first logic state and the storage node data having the first logic state. The example method of FIG. 11 also includes indicating 1120 the compare data input fails to match the storage node data using the NFET of the transmission gate based upon the compare data input having the second logic state and the storage node data having the first logic state.

For further explanation, FIG. 12 sets forth a flowchart diagram depicting an additional exemplary method for performing a single-bit compare operation using a content-addressable memory (CAM) Array in a computing environment by a processor in accordance with some embodiments of the present disclosure. Like the example method of FIG. 10, the example method of FIG. 12 also includes comparing 1020 the compare data input having a first logic state with the storage node data having a second logic state using a passgate, wherein the passgate is an n-channel metal oxide semiconductor (NMOS) transistor and the storage node data of a storage cell is used to control the passgate based on the storage node data. The example method of FIG. 12 may include comparing 1030 the compare data input with the storage node data having the second logic state using a PFET stack, having a first PFET and a second PFET.

The example method of FIG. 12 also includes indicating 1210 the compare data input matches the storage node data using the PFET stack based upon the compare data input having the second logic state and the storage node data having the second logic state; and indicating 1220 the compare data input fails to match the storage node data using the passgate based upon the compare data input having the first logic state and the storage node data having the second logic state.

For further explanation, FIG. 13 sets forth an additional block diagram depicting an exemplary dual-bit compare content-addressable memory (CAM) cell having a pre-comparison circuit to eliminate a set of compare inputs in accordance with some embodiments of the present disclosure. Repetitive description of like elements employed in other embodiments described herein is omitted for sake of brevity.

FIG. 13 depicts the CAM Cell Memory 410 having a 6T SRAM cell 702 and one or more comparator 1310, which may include, for example, the comparator 604 (e.g., comparator 1), which may be included in the CAM cell memory array 400 of FIG. 4, and a match generation circuit 1330. The comparator 1310, including the comparator 604 and the match generation circuit 1330, may be in communication with a storage system such as, for example the 6T SRAM storage cell 702.

The CAM cell memory 410 may also include, either externally or internally therein, a pre-comparison circuit 1320. The comparator 1310 (including the comparator 604, of the CAM cell memory 410, and the match generation circuit 1330) may be in communication with the pre-comparison circuit 1320, which is another comparison circuit 604. Said differently, the comparator 604 includes the match generation circuit 1330 that may include one or more transistors for generating a first compare match based on the compare output and a second compare match based on the pre-compare signal. Together, the comparator 604 and the match generation circuit 1330 combined to create the comparator 1310. The pre-comparison circuit 1320 is a second comparison circuit 604 of FIG. 6, but the inputs such as, for example, a first compare input (e.g., CMP0) and a second compare input (e.g., CMP1) is input into the PFET stack 630 of FIG. 7.

In some embodiments, the pre-comparison circuit 1320 may compare inputs CMP0 and CMP1 to the CAM array 400. In some embodiments, the pre-comparison circuit 1320 may pre-compare the compare data inputs (e.g., CMP0 and CMP1) to determine if the compare data inputs are the same or different such as, for example determining whether the compare data inputs have the same compare data input polarity (e.g., the same logic state such as, for example, high "1" or low "0"). In one aspect, the CMP0 and CMP1 may be the CMP0_T and CMP0_C (e.g., the TRUE and COMPLEMENT compare data inputs) or may be referred to as Q and QB, respectively.

In some embodiments, the pre-comparison circuit 1320 generates a single pre-comparison signal (e.g., CMP_0_1) signal indicating that either the two compare inputs are same or the two compare inputs are different. The pre-comparison circuit 1320 may execute a single comparison using a first compare input (e.g., the true compare data input) with the stored data of the storage system such as, for example, the 6T SRAM cell. In some embodiments, the pre-comparison circuit 1320 may determine the state of the two compare outputs of the true compare data input and the stored data node input using the pre-compare results. In some embodiments, the stored data (e.g., a comparand in the CAM cell memory 410) is constant and that the compare inputs (e.g., comparanda) may be similar or dissimilar from each other, and from the comparand. In some embodiments, only one polarity of one comparanda data is routed to the CAM cell 410.

The match generation circuit 1330 may generate a first compare match (e.g., MATCH0) based on the compare output generated by combining CMPOUT0 from each bit in a row of the CAM cell 410 and a second compare match (e.g., MATCH1) based on the pre-compare signal CMP_0_1 and the output CMPOUT0 from each bit in a row of the CAM cell 410.

In some embodiments, the CAM cell 410 includes the smaller comparator 604 and includes the match generation circuit 1330 that is a smaller footprint than the existing implementation. The CAM cell 410 uses the gating technique, as described herein, to utilize the existing storage nodes in the 6T SRAM cell for the compare and MATCH output generation using the match generation circuit 1330 and the 6T SRAM storage cell 702 for read and write.

Thus, the pre-comparison circuit 1320 compares the CMP0 and CMP1 inputs to determine if they are the same or different. This comparison is done once per column slice of the CAM array 400. In some embodiments, a pre-comparison circuit 1320 is provided for each column of the CAM array 400. The output of the pre-comparison circuit 1320 is a pre-compare signal (e.g., CMP_0_1 signal) along with the first compare input (e.g., CMP0_T) is routed to each CAM cell 410 of a CAM array 400 for comparison and output generation. IT should be noted that first compare input (e.g., CMP0_T) may be replaced by a second compare input (e.g., CMP1_T). Moreover, CMP0_T may be used on a first column in the CAM cell 410 (e.g., Column0) and CMP1_T on the adjacent column in order to balance a load on the CMP0 and CMP1 inputs.

Additionally, the CAM Cell Memory 410 as reduced dimensions in both width and height directions due to reduced transistor count in the comparator and elimination of 2 metal tracks per dual-bit compare cell. In some embodiments, the CAM Cell Memory 410, as depicted in FIG. 13, reduces the transistor count from 20 transistors to less than nine transistors in the CAM Cell Memory 410, and an addition of 5 transistor pre-compare circuit per column in the CAM Cell Memory 410. For example, for a 38 entry (e.g., 38 rows) array, the overall reduction is 413 (e.g., 11 columns multiplied by 38 rows and then subtracted by five such as, for example, 11*38−5=413−5), which yields a 50% reduction in the number of transistor devices. Also, the PFET stack (e.g., PFET stack 630 of FIG. 7) is not connected to a ground ("GND") node thereby allowing more flexibility in the placement, and reduced load on the GND supply. The static leakage of the CAM array 400 is reduced due to few transistors. The smaller CAM Cell Memory 410 enables efficient pitch matching with single-bit compare cells in the same CAM array 400. The reduced cell tracks of the CAM Cell Memory 410 will enable lower wire resistance for the MATCHLINES and WORDLINES thereby improving the performance. The reduced cell width of the CAM Cell Memory 410 will enable lower RC on the COMPARE inputs and BITLINES thereby improving BL sense and WRITE time, which may also lower the data driver sizes and COMPARE input buffers 603.

Figure 14:
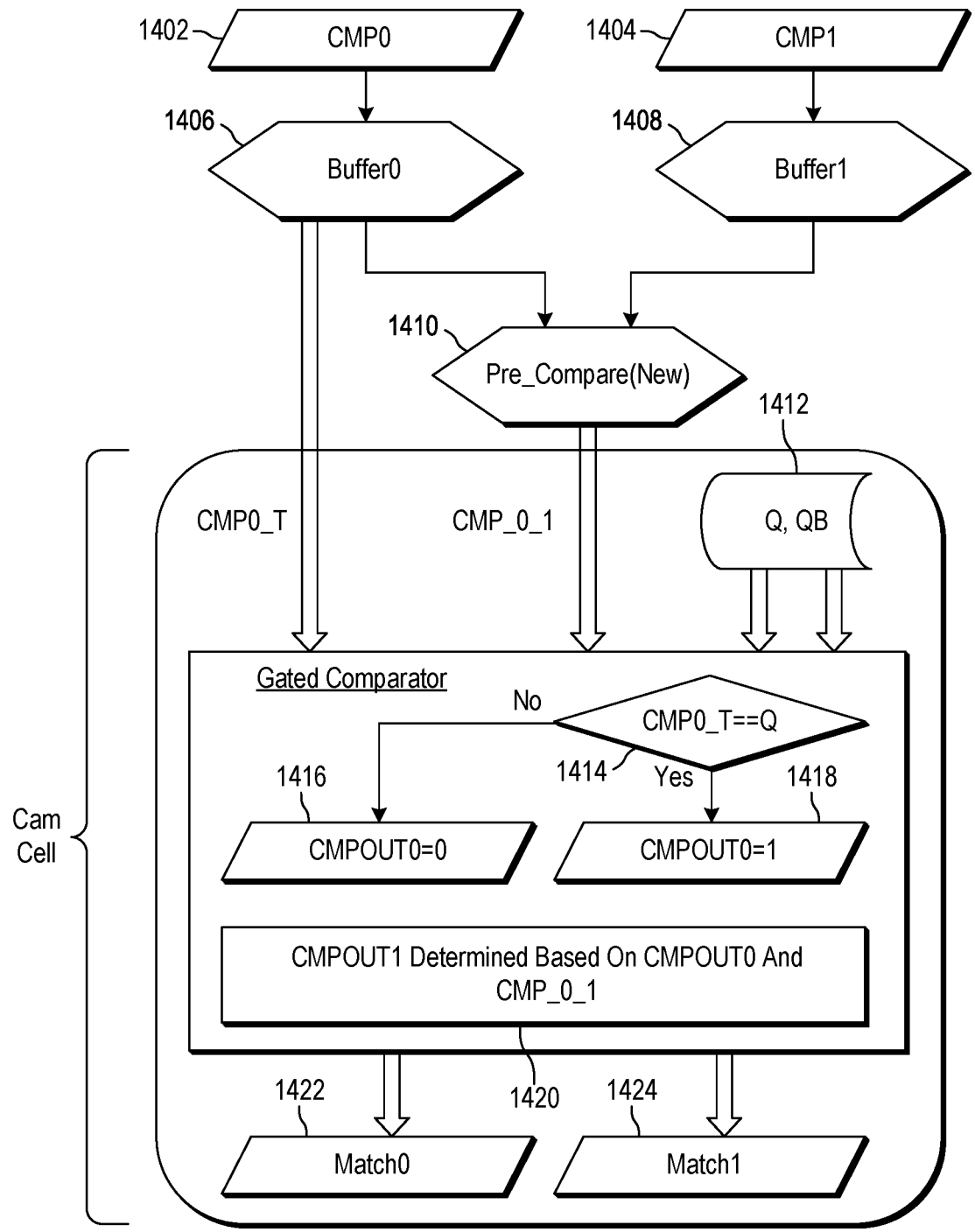
FIG. 14 sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure.

For further explanation, FIG. 14 sets forth a flowchart diagram depicting an exemplary method for pre-comparing data in a dual compare content compact, low-leakage multi-bit content-addressable memory (CAM) cell (or a multi-bit compare content compact, low-leakage multi-bit content-addressable memory CAM cell) in accordance with some embodiments of the present disclosure. The functionality 1400 may be implemented as a method (e.g., a computer-implemented method) executed as instructions on a machine, where the instructions are included on at least one computer readable medium or one non-transitory machine-readable storage medium.

The functionality 1400 may be implemented as a method (e.g., a computer-implemented method) executed as instructions on a machine, where the instructions are included on at least one computer readable medium or one non-transitory machine-readable storage medium. FIG. 14 also illustrates the operations for the pre-comparison circuit 1320 (which is the addition of a second comparator such as, for example, the comparator 604 of FIG. 6) and the match generation circuit 1330 of FIG. 13. The operations for the pre-comparison circuit 1320 and the match generation circuit 1330 of FIG. 13 may be extended and applied to the comparator 604 of FIGS. 6 and 7.

As indicated in FIG. 14, a first compare input 1402 ("CMP0") and a second compare input 1404 (CMP1) of a column of a dual CAM cell may be received as input and placed into buffers 1406 and 1408 (buffer0 and buffer1 or buffers 603 of FIG. 6). A pre-comparison operation 1410, executed by the pre-comparison circuit 1320 of FIG. 13, may compare the first compare input 1402 ("CMP0) and the second compare input 1404 (CMP1).

The pre-comparison circuit 1320 may generate a pre-compare signal (CMP_0_1_) based on comparing 1410 the first compare input and the second compare input. The pre-comparison circuit 1320 may send/route the pre-compare signal to the comparator 604 (e.g., a gated comparator). The pre-comparison circuit 1320 may send/route only one of the compare inputs such as, for example, the first compare input to the comparator 604 (e.g., a gated comparator).

The comparator 604 may compare 1414 a first polarity of the first compare input with a first polarity a storage node data (e.g., Q, QB at block 1412). That is, the comparison 1414 determines whether the logic state of the first compare input is equal to the logic state of the stored node data (Q) and generate a compare output (CMPOUT0) of the first compare input based on a logic state of the pre-compare signal.

If the first polarity of the first compare input matches the first polarity a storage node data in the comparison operation 1414, a logic state of the compare output (CMPOUT0) is set as first logic state 1416 (e.g., high "1" where CMPOUT0=1) based on comparing the first polarity of the first compare input with the first polarity the storage node data.

If the first polarity of the first compare input fails to match the first polarity a storage node data in the comparison operation 1414, a logic state of the compare output (CMPOUT0) is set as a second logic state 1418 (e.g., low "01" where CMPOUT0=0) based on comparing the first polarity of the first compare input with the first polarity the storage node data. A CMPOUT1 may be determined based on the compare output (CMPOUT0) and the pre-compare signal (CMP_0_1_), as in block 1420.

The match generation circuit 1330 of FIG. 13 may generate 1422 a first compare match (MATCH0) based on the compare output and generate 1424 a second compare match (MATCH1) based on the pre-compare signal. That is, the match generation circuit 1330 of FIG. 13 may generate 1422 a first compare match (MATCH0) by combining the compare output from each bit in a row of the dual compare CAM cell 410 (e.g., two compare circuits, which may be coupled to additional match lines and compare line pairs) and generate 1424 the second compare match (MATCH1) by combining the pre-compare signal from each bit in a row of the dual compare CAM cell 410.

Figure 15:
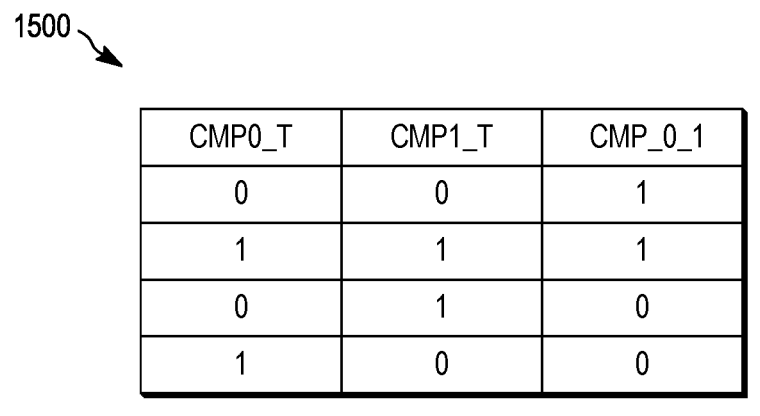

For further explanation, FIG. 15 sets forth a table 1500 depicting a logic state of the pre-compare signal for the different input conditions of the first compare input (CMP0 or CMP0_T) and the second compare input (CMP1 or CMP1_T). For example, the results (e.g.,) of the first row indicate the logic state of the pre-compare signal (CMP_0_1) is high "1" when the logic state of the first compare input (CMP0 or CMP0_T) is low "0" and the logic state of the second compare input (CMP1 or CMP1_T) is low "0". The second row indicates the logic state of the pre-compare signal (CMP_0_1) is high "1" when the logic state of the first compare input (CMP0 or CMP0_T) is high "1" and the logic state of the second compare input (CMP1 or CMP1_T) is high "1". The third row indicates the logic state of the pre-compare signal (CMP_0_1) is low "0" when the logic state of the first compare input (CMP0 or CMP0_T) is low "0" and the logic state of the second compare input (CMP1 or CMP1_T) is high "1". The fourth row indicates the logic state of the pre-compare signal (CMP_0_1) is low "0" when the logic state of the first compare input (CMP0 or CMP0_T) is high "1" and the logic state of the second compare input (CMP1 or CMP1_T) is low "0".

For further explanation, FIG. 16 sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure.

The example method of FIG. 16 includes comparing 1610 a first compare input and a second compare input of a column in a dual compare content addressable memory ("CAM") device. For example, the pre-comparison circuit 1320 may pre-compare a first compare input (e.g., CMP0) and a second compare input (e.g., CMP1) to determine if the first compare input and a second compare input have the same logic state such as, for example determining whether the compare data inputs have the same compare data input polarity (e.g., the same logic state such as, for example, high "1" or low "0"). In one aspect, the first compare input (e.g., CMP0) may be the TRUE compare data inputs (e.g., CMP0_T) and the second compare input may be the COMPLEMENT compare data input (e.g., the CMP0_C).

The example method of FIG. 16 includes generating 1620 a pre-compare signal based on comparing the first compare input and the second compare input. For example, the pre-comparison circuit 1320 may generate the pre-compare signal based on pre-comparing the first compare input (e.g., CMP0) and the second compare input (e.g., the CMP1).

The example method of FIG. 16 includes comparing 1630 a first polarity of the first compare input with a first polarity a storage node data. For example, the pre-comparison circuit 1320 may compare a logic state (e.g., high "1" or low "0") of the first compare input (e.g., CMP0) with the logic state (e.g., high "1" or low "0") of the stored data node of the 6T SRAM storage cell 702.

The example method of FIG. 16 includes generating 1640 a compare output of the first compare input based on a logic state of the pre-compare signal. For example, the pre-comparison circuit 1320 may generate a compare output (CMPOUT) of the first compare input (e.g., CMP0) based on the logic state (e.g., high "1" or low "0") of the pre-compare signal.

The example method of FIG. 16 includes generating 1650 a first compare match based on the compare output and a second compare match based on the pre-compare signal. For example, the match generation circuit 1330 may generate a first compare match (e.g., MATCH0) based on the compare output generated by combining CMPOUT0 from each bit in a row of the CAM cell 410 and a second compare match (e.g., MATCH1) based on the pre-compare signal (CMPOUT1) from each bit in a row of the CAM cell 410.

For further explanation, FIG. 17 sets forth a flowchart diagram depicting an additional exemplary method for sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure. Like the example method of FIG. 16, the example method of FIG. 17 also includes comparing 1610 a first compare input and a second compare input of a column in a dual compare content addressable memory ("CAM") device; generating 1620 a pre-compare signal based on comparing the first compare input and the second compare input; comparing 1630 a first polarity of the first compare input with a first polarity a storage node data; generating 1640 a compare output of the first compare input based on a logic state of the pre-compare signal; and generating 1650 a first compare match based on the compare output and a second compare match based on the pre-compare signal.

The example method of FIG. 17 also includes determining 1710 the first compare input and a second compare input have similar logic states or dissimilar logic states. For example, the pre-comparison circuit 1320 may whether the logic state (e.g., high "1" or low "0") of the first compare input (e.g., CMP0) is similar to or dissimilar to the logic state (e.g., high "1" or low "0") of the second compare input (e.g., the CMP1).

For further explanation, FIG. 18 sets forth a flowchart diagram depicting an additional exemplary method for sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure. Like the example method of FIG. 16, the example method of FIG. 18 also includes comparing 1610 a first compare input and a second compare input of a column in a dual compare content addressable memory ("CAM") device; generating 1620 a pre-compare signal based on comparing the first compare input and the second compare input; comparing 1630 a first polarity of the first compare input with a first polarity a storage node data; generating 1640 a compare output of the first compare input based on a logic state of the pre-compare signal; and generating 1650 a first compare match based on the compare output and a second compare match based on the pre-compare signal.

The example method of FIG. 18 also includes determining 1810 a logic state of the compare output based on comparing the first polarity of the first compare input with the first polarity a storage node data. For example, the pre-comparison circuit 1320 may identify or determine whether the compare output is high ("1") or low ("0") based on compare the logic state (e.g., high "1" or low "0") of the first compare input (e.g., CMP0) with the logic state (e.g., high "1" or low "0") of the storage node of the 6T SRAM storage cell 702.

For further explanation, FIG. 19 sets forth a flowchart diagram depicting an additional exemplary method for sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure. Like the example method of FIG. 16, the example method of FIG. 19 also includes comparing 1610 a first compare input and a second compare input of a column in a dual compare content addressable memory ("CAM") device; generating 1620 a pre-compare signal based on comparing the first compare input and the second compare input; comparing 1630 a first polarity of the first compare input with a first polarity a storage node data; generating 1640 a compare output of the first compare input based on a logic state of the pre-compare signal; and generating 1650 a first compare match based on the compare output and a second compare match based on the pre-compare signal.

The example method of FIG. 19 also includes setting 1910 a logic state of the compare output as a first logic state or a second logic state based on comparing the first polarity of the first compare input with the first polarity a storage node data. For example, the pre-comparison circuit 1320 may set the compare output as high ("1") or low ("0") based on comparing the logic state (e.g., high "1" or low "0") of the first compare input (e.g., CMP0) with the logic state (e.g., high "1" or low "0") of the storage node of the 6T SRAM storage cell 702. In some embodiments, the pre-comparison circuit 1320 may set the logic state of the compare output as high ("1"). In some embodiments, the pre-comparison circuit 1320 may set the logic state of the compare output as low ("0").

For further explanation, FIG. 20 sets forth a flowchart diagram depicting an additional exemplary method for sets forth a flowchart diagram depicting an additional exemplary method for pre-comparing data in a dual compare content compact, low-leakage multi-bit content-addressable memory (CAM) cell in a computing environment by a processor in accordance with some embodiments of the present disclosure. Like the example method of FIG. 16, the example method of FIG. 20 also includes comparing 1610 a first compare input and a second compare input of a column in a dual compare content addressable memory ("CAM") device; generating 1620 a pre-compare signal based on comparing the first compare input and the second compare input; comparing 1630 a first polarity of the first compare input with a first polarity a storage node data; generating 1640 a compare output of the first compare input based on a logic state of the pre-compare signal; and generating 1650 a first compare match based on the compare output and a second compare match based on the pre-compare signal.

The example method of FIG. 20 also includes generating 2010 the first compare match by combining the compare output from each bit in a row of the dual compare CAM device and generating the second compare match by combining the pre-compare signal from each bit in a row of the dual compare CAM device. For example, the match generation circuit 1330 may generate a first compare match (e.g., MATCH0) based on the compare output generated by combining CMPOUT0 from each bit in a row of the CAM cell 410 and a second compare match (e.g., MATCH1) based on the pre-compare signal (CMP_0_1) and CMPOUT0 from each bit in a row of the CAM cell 410.

The present disclosure may be a system, a method, or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and a wireless network. The network may comprise copper transmission cables, optical transmission fibers, wireless transmission, routers, firewalls, switches, gateway computers and edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and block diagrams of methods, apparatus (systems), and computer program products according to embodiments of the disclosure. It will be understood that each block of the flowchart illustrations and block diagrams, and combinations of blocks in the flowchart illustrations and block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowcharts and block diagram block or blocks. These computer readable program instructions may also be stored in a computer readable storage medium that can direct a computer, a programmable data processing apparatus, and other devices to function in a particular manner, such that the computer readable storage medium having instructions stored therein comprises an article of manufacture including instructions which implement aspects of the function/act specified in the flowcharts and block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and block diagram block or blocks.

The flowcharts and block diagrams in the Figures illustrate the architecture, functionality, and operation of possible implementations of systems, methods, and computer program products according to various embodiments of the present disclosure. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and flowchart illustrations, and combinations of blocks in the block diagrams and flowchart illustrations, can be implemented by special purpose hardware-based systems that perform the specified functions or acts or carry out combinations of special purpose hardware and computer instructions.

The descriptions of the embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for pre-comparing data in a dual compare content addressable memory ("CAM") device having one or more comparators, comprising:
    comparing a first compare input and a second compare input of a column in a dual compare content addressable memory ("CAM") device;
    generating a pre-compare signal based on comparing the first compare input and the second compare input;
    comparing a first polarity of the first compare input with a first polarity of a storage node data;
    generating a compare output of the first compare input based on a logic state of the pre-compare signal; and
    generating a first compare match based on the compare output and a second compare match based on the pre-compare signal.

2. The method of claim 1, wherein comparing the first compare input and the second compare input of a column in a dual CAM device further includes determining the first compare input and a second compare input have similar logic states.

3. The method of claim 1, wherein generating the compare output of the first compare input based on the logic state of the pre-compare signal further includes determining the first compare input and the second compare input have dissimilar logic states.

4. The method of claim 1, wherein generating the compare output of the first compare input based on the logic state of the pre-compare signal further includes determining a logic state of the compare output based on comparing the first polarity of the first compare input with the first polarity of a storage node data.

5. The method of claim 1, wherein generating the compare output of the first compare input based on the logic state of the pre-compare signal further includes setting a logic state of the compare output as a first logic state based on comparing the first polarity of the first compare input with the first polarity of a storage node data.

6. The method of claim 1, wherein generating the compare output of the first compare input based on the logic state of the pre-compare signal further includes setting a logic state of the compare output as a second logic state based on comparing the first polarity of the first compare input with a first polarity of a storage node data.

7. The method of claim 1, wherein generating a first compare match based on the compare output and a second compare match based on the pre-compare signal further includes generating the first compare match by combining the compare output from each bit in a row of the dual compare CAM device and generating the second compare match by combining the pre-compare signal from each bit in a row of the dual compare CAM device.

8. A system for pre-comparing data in a compare content addressable memory ("CAM") device having one or more comparators in a computing environment, comprising one or more computers with executable instructions that when executing cause the system to:
   compare a first compare input and a second compare input of a column in a compare content addressable memory ("CAM") device;
   generate a pre-compare signal based on comparing the first compare input and the second compare input;
   compare a first polarity of the first compare input with a first polarity of a storage node data;
   generate a compare output of the first compare input based on a logic state of the pre-compare signal; and
   generate a first compare match based on the compare output and a second compare match based on the pre-compare signal.

9. The system of claim 8, wherein the executable instructions when executed cause the system to determine the first compare input and a second compare input have similar logic states, wherein the CAM devices is a dual-bit CAM device or a multi-bit CAM device.

10. The system of claim 8, wherein the executable instructions when executed cause the system to determine the first compare input and the second compare input have dissimilar logic states.

11. The system of claim 8, wherein the executable instructions when executed cause the system to determine a logic state of the compare output based on comparing the first polarity of the first compare input with the first polarity of a storage node data.

12. The system of claim 8, wherein the executable instructions when executed cause the system to set a logic state of the compare output as a first logic state based on comparing the first polarity of the first compare input with the first polarity of a storage node data.

13. The system of claim 8, wherein the executable instructions when executed cause the system to set a logic state of the compare output as a second logic state based on comparing the first polarity of the first compare input with a first polarity of a storage node data.

14. The system of claim 8, wherein generating a first compare match based on the compare output and a second compare match based on the pre-compare signal further includes generating the first compare match by combining the compare output from each bit in a row of the compare CAM device and generating the second compare match by combining the pre-compare signal from each bit in a row of the compare CAM device.

15. A computer program product for pre-comparing data in a dual compare content addressable memory ("CAM") device having one or more comparators in a computing environment, the computer program product comprising one or more computer readable storage media, and program instructions collectively stored on the one or more computer readable storage media, the program instruction comprising:
   program instructions to compare a first compare input and a second compare input of a column in a dual compare content addressable memory ("CAM") device;
   program instructions to generate a pre-compare signal based on comparing the first compare input and the second compare input;
   program instructions to compare a first polarity of the first compare input with a first polarity of a storage node data;
   program instructions to generate a compare output of the first compare input based on a logic state of the pre-compare signal; and
   program instructions to generate a first compare match based on the compare output and a second compare match based on the pre-compare signal.

16. The computer program product of claim 15, further including program instructions to determine the first compare input and a second compare input have similar logic states.

17. The computer program product of claim 15, further including program instructions to determine the first compare input and the second compare input have dissimilar logic states.

18. The computer program product of claim 15, further including program instructions to determine a logic state of the compare output based on comparing the first polarity of the first compare input with the first polarity of a storage node data.

19. The computer program product of claim 15, further including program instructions to set a logic state of the compare output as a first logic state or second logic state based on comparing the first polarity of the first compare input with the first polarity of a storage node data.

20. The computer program product of claim 15, wherein generating a first compare match based on the compare output and a second compare match based on the pre-compare signal further includes generating the first compare match by combining the compare output from each bit in a row of the dual compare CAM device and generating the second compare match by combining the pre-compare signal from each bit in a row of the dual compare CAM device.

* * * * *